(12) United States Patent
Kurita

(10) Patent No.: US 10,475,767 B2
(45) Date of Patent: Nov. 12, 2019

(54) ELECTRONIC DEVICE

(71) Applicant: Kabushiki Kaisha Toshiba, Tokyo (JP)

(72) Inventor: Yoichiro Kurita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/029,194

(22) Filed: Jul. 6, 2018

(65) Prior Publication Data

US 2019/0206837 A1    Jul. 4, 2019

(30) Foreign Application Priority Data

Jan. 4, 2018 (JP) .................................. 2018-000065
Jun. 7, 2018 (JP) .................................. 2018-109356
Jul. 5, 2018 (JP) .................................. 2018-128380

(51) Int. Cl.
*H01L 25/065* (2006.01)
*G06N 3/04* (2006.01)

(52) U.S. Cl.
CPC ............ *H01L 25/0652* (2013.01); *G06N 3/04* (2013.01); *H01L 2225/06513* (2013.01); *H01L 2225/06534* (2013.01); *H01L 2225/06548* (2013.01); *H01L 2225/06555* (2013.01); *H01L 2225/06572* (2013.01); *H01L 2225/06593* (2013.01)

(58) Field of Classification Search
CPC ....... H01L 25/0652; H01L 2225/06513; H01L 2225/06534; H01L 2225/06548; H01L 2225/06555; H01L 2225/06572; H01L 2225/06593; G06N 3/04

USPC ......................................................... 257/777
See application file for complete search history.

(56) References Cited

U.S. PATENT DOCUMENTS

| 8,039,969 | B2 | 10/2011 | Kurita |
| 9,396,998 | B2 | 7/2016 | Kurita et al. |
| 2006/0063312 | A1 | 3/2006 | Kurita |
| 2010/0140779 | A1* | 6/2010 | Lin .................... H01L 23/49816 257/690 |
| 2017/0062383 | A1* | 3/2017 | Yee ...................... H01L 25/0652 |

FOREIGN PATENT DOCUMENTS

| JP | 2006-19433 A | 1/2006 |
| JP | 5466203 B2 | 4/2014 |
| JP | 2015-188052 A | 10/2015 |

* cited by examiner

*Primary Examiner* — Tong-Ho Kim
(74) *Attorney, Agent, or Firm* — Finnegan, Henderson, Farabow, Garrett & Dunner, L.L.P.

(57) ABSTRACT

According to one embodiment, the interconnect layer includes a fourth conductive member and a fifth conductive member. The fourth conductive member is provided between the first region of the first chip and the third region of the second chip. The fourth conductive member connects the first conductive member of the first chip and the second conductive member of the second chip. The fifth conductive member is provided between the second region of the first chip and the fifth region of the third chip. The fifth conductive member connects the first conductive member of the first chip and the third conductive member of the third chip. The first chip is provided between the first terminal and the second terminal.

14 Claims, 25 Drawing Sheets

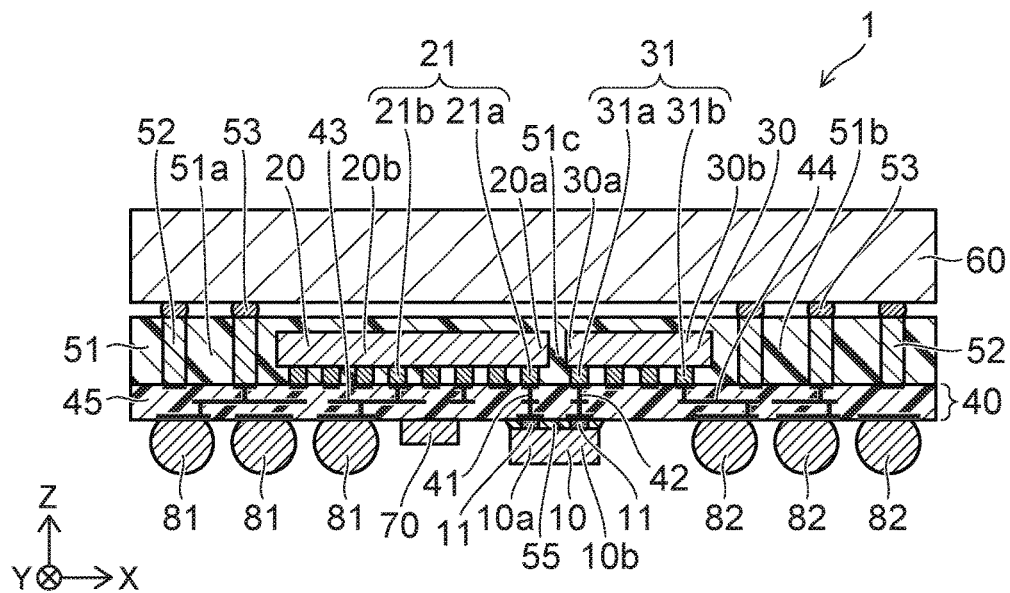
FIG. 1A
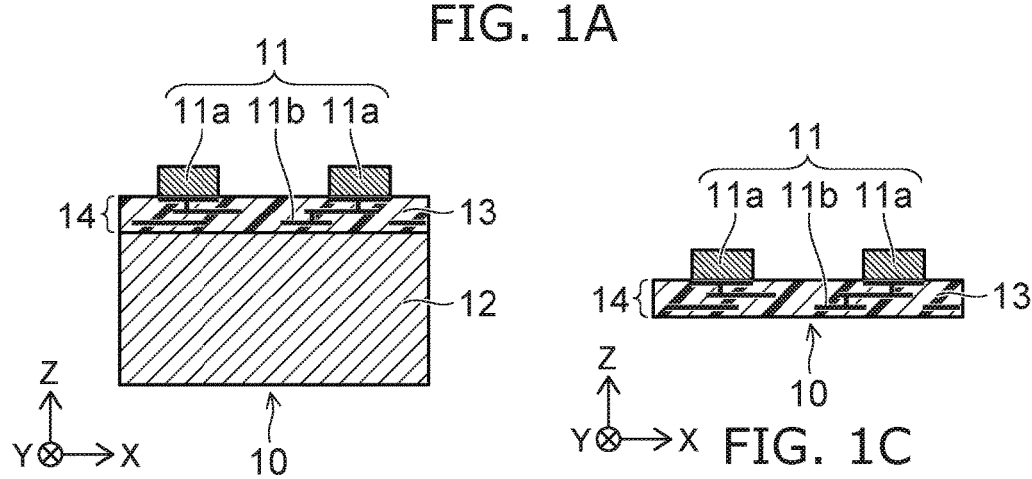
FIG. 1B
FIG. 1C
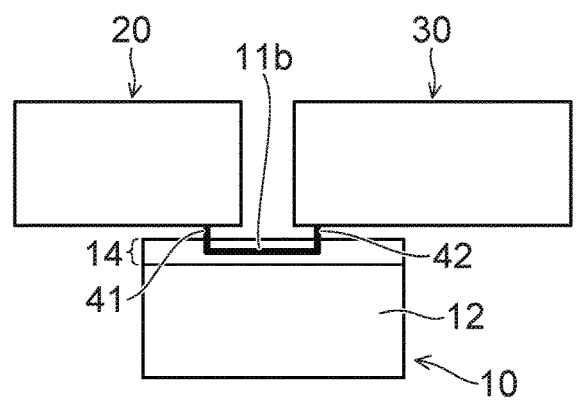
FIG. 1D

US 10,475,767 B2

ELECTRONIC DEVICE

CROSS-REFERENCE TO RELATED APPLICATIONS

This application is based upon and claims the benefit of priority from Japanese Patent Application No. 2018-000065, filed on Jan. 4, 2018, Japanese Patent Application No. 2018-109356, filed on Jun. 7, 2018, and Japanese Patent Application No. 2018-128380, filed on Jul. 5, 2018; the entire contents of all of which are incorporated herein by reference.

FIELD

Embodiments described herein relate generally to an electronic device.

BACKGROUND

A fan-out interconnect layer performs the role of connecting signal lines between multiple chips and the role of power supply to the chips.

BRIEF DESCRIPTION OF THE DRAWINGS

FIG. 1A is a schematic cross-sectional view illustrating an electronic device according to a first embodiment, FIGS. 1B and 1C are schematic enlarged cross-sectional views of a first chip of the electronic device according to the first embodiment, and FIG. 1D is a schematic view showing a connectional relationship of the first chip, a second chip, and a third chip of the electronic device according to the first embodiment;

DETAILED DESCRIPTION

Figure 2A:
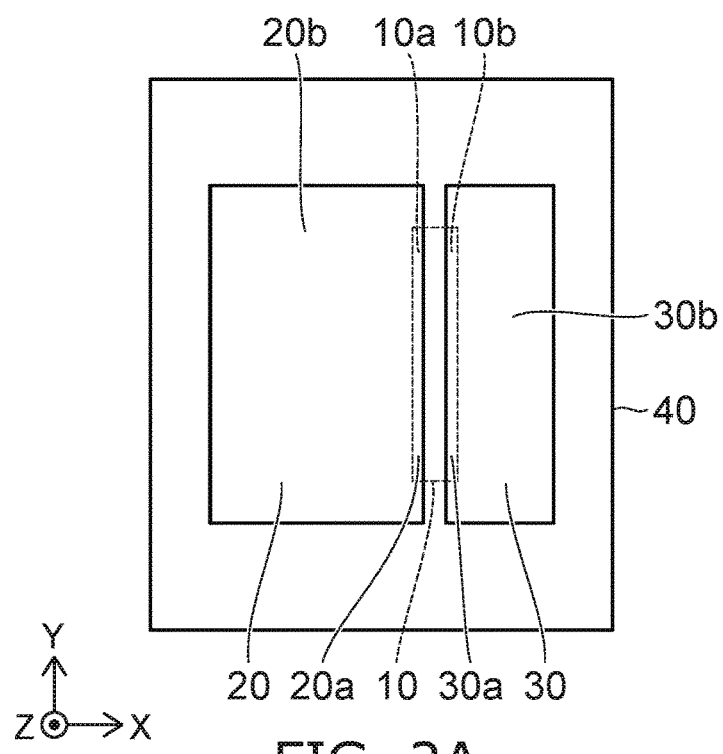
FIG. 2A is a schematic plan view showing an arrangement example of the first chip, the second chip, and the third chip of the electronic device according to the first embodiment.

According to one embodiment, an electronic device includes a first chip, a second chip, a third chip, a first terminal, a second terminal, and an interconnect layer. The first chip includes a first conductive member, a first region, and a second region. The second chip includes a second conductive member, a third region, and a fourth region. The third chip includes a third conductive member, a fifth region, and a sixth region. The interconnect layer is provided between the first region of the first chip and the third region of the second chip, between the second region of the first chip and the fifth region of the third chip, between the first terminal and the fourth region of the second chip, and between the second terminal and the sixth region of the third chip. The interconnect layer includes a fourth conductive member and a fifth conductive member. The fourth conductive member is provided between the first region of the first chip and the third region of the second chip. The fourth conductive member connects the first conductive member of the first chip and the second conductive member of the second chip. The fifth conductive member is provided between the second region of the first chip and the fifth region of the third chip. The fifth conductive member connects the first conductive member of the first chip and the third conductive member of the third chip. The first chip is provided between the first terminal and the second terminal.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

In the following embodiments, an electronic device is, for example, a semiconductor device.

First Embodiment

FIG. 1A is a schematic cross-sectional view illustrating an electronic device 1 according to a first embodiment.

FIGS. 1B and 1C are schematic enlarged cross-sectional views of a first chip 10 of the electronic device 1.

FIG. 1D is a schematic view showing the connectional relationship of the first chip 10, a second chip 20, and a third chip 30 of the electronic device 1.

FIG. 2A is a schematic plan view showing an arrangement example of the first chip 10, the second chip 20, and the third chip 30 of the electronic device 1.

Figure 2B:
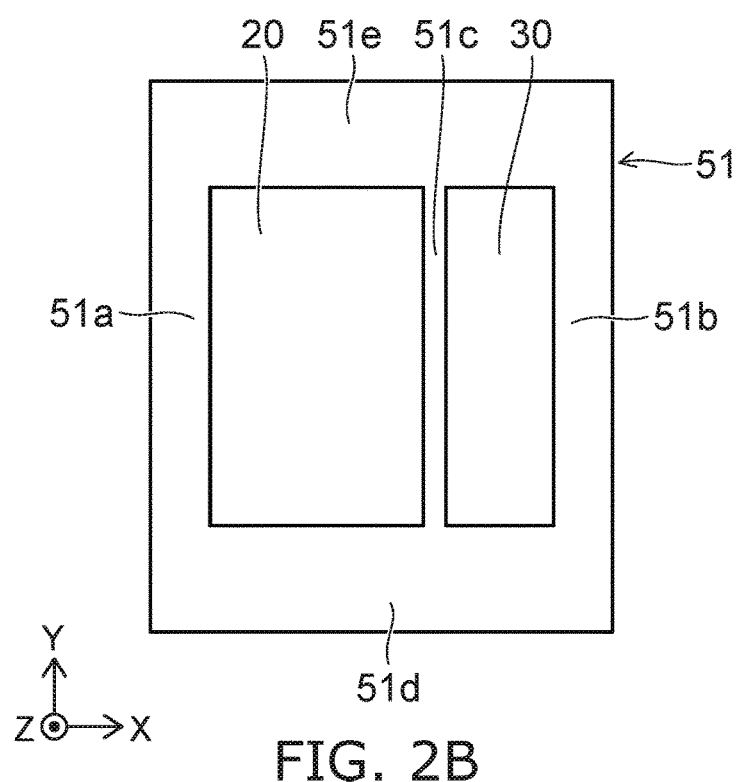
FIG. 2B is a schematic plan view of the second chip, the third chip, and a resin portion of the electronic device according to the first embodiment.

FIG. 2B is a schematic plan view of the second chip 20, the third chip 30, and a resin portion 51 of the electronic device 1.

As shown in FIG. 1A, the electronic device 1 according to the first embodiment includes an interconnect layer 40, the first chip 10, the second chip 20, the third chip 30, the resin portion 51, multiple first terminals 81, and multiple second terminals 82.

The first chip 10 includes a first region 10a and a second region 10b. The second chip 20 includes a third region 20a and a fourth region 20b. The third chip 30 includes a fifth region 30a and a sixth region 30b.

The direction from the first region 10a of the first chip 10 toward the third region 20a of the second chip 20 is aligned with a first direction. The direction from the second region 10b of the first chip 10 toward the fifth region 30a of the third chip 30 is aligned with the first direction.

The first direction is taken as a Z-axis direction. One direction perpendicular to the Z-axis direction is taken as an X-axis direction. A direction perpendicular to the Z-axis direction and the X-axis direction is taken as a Y-axis direction.

For example, the interconnect layer 40 is aligned with the X-Y plane.

A second direction from the second chip 20 toward the third chip 30 crosses the first direction. In the example, the second direction is aligned with the X-axis direction.

The direction from the first region 10a of the first chip 10 toward the fourth region 20b of the second chip 20 crosses the first direction and the second direction. The direction from the second region 10b of the first chip 10 toward the sixth region 30b of the third chip 30 crosses the first direction and the second direction.

The interconnect layer 40 is provided between the first region 10a of the first chip 10 and the third region 20a of the second chip 20, between the second region 10b of the first chip 10 and the fifth region 30a of the third chip 30, between the fourth region 20b of the second chip 20 and the first terminals 81, and between the sixth region 30b of the third chip 30 and the second terminals 82.

As shown in FIG. 1B, the first chip 10 includes a substrate 12 and an interconnect layer 14. The thickness along the Z-axis direction of the substrate 12 is thicker than the thickness along the Z-axis direction of the interconnect layer 14.

The substrate 12 is, for example, a silicon substrate or a glass substrate. The interconnect layer 14 is, for example, an interconnect layer formed by a damascene process and/or a semi-additive process. The interconnect layer 14 includes an insulating layer 13 and a first conductive member 11. A high-resistance silicon substrate may be used as the substrate 12 in the case where the first chip 10 is a bridge chip that does not include an element and simply functions as only an interconnect. The specific resistance of the high-resistance silicon substrate is, for example, 10 Ωcm or more.

The first conductive member 11 is, for example, a metal member. The first conductive member 11 includes multiple electrode terminals 11a, and a conductive layer 11b connected to the electrode terminals 11a. The conductive layer 11b is provided between the substrate 12 and the electrode terminals 11a.

Or, as shown in FIG. 1C, the first chip 10 includes only the interconnect layer 14 including the first conductive member 11 and does not include the substrate 12. The substrate 12 can be removed after forming the interconnect layer 14 in the substrate 12.

As shown in FIG. 1A, an insulating portion 55 is provided between the first chip 10 and the interconnect layer 40. For example, the insulating portion 55 is made of a resin material or an inorganic material. The insulating portion 55 covers the first conductive member 11. For example, the insulating portion 55 can be injected after connecting the first conductive member 11 to the interconnect layer 40. Or, a formation method may be used in which the insulating portion 55 is pre-formed in a region including the periphery of the first conductive member 11; and the insulating portion 55 is connected to the interconnect layer 40 simultaneously with the first conductive member 11.

The second chip 20 includes a second conductive member 21 as shown in FIG. 1A. The second conductive member 21 is, for example, a metal member. The second conductive member 21 includes a first signal terminal 21a, a first power supply terminal 21b, and a conductive layer (not illustrated) connected to the first signal terminal 21a and the first power supply terminal 21b. The second chip 20 includes, for example, a logic element. For example, the logic element is used mainly for functions relating to the calculation/control of information.

The third chip 30 includes a third conductive member 31 as shown in FIG. 1A. The third conductive member 31 is, for example, a metal member. The third conductive member 31 includes a second signal terminal 31a, a second power supply terminal 31b, and a conductive layer (not illustrated) connected to the second signal terminal 31a and the second power supply terminal 31b. The third chip 30 includes, for example, a memory element. For example, the memory element is used mainly for functions relating to the storage of information.

The interconnect layer 40 includes an insulating layer 45, a fourth conductive member 41, a fifth conductive member 42, a sixth conductive member 43, and a seventh conductive member 44.

The insulating layer 45 is, for example, a resin layer. The insulating layer 45 is provided between the fourth conductive member 41, the fifth conductive member 42, the sixth conductive member 43, and the seventh conductive member 44. The insulating layer 45 insulatively separates between the fourth conductive member 41, the fifth conductive member 42, the sixth conductive member 43, and the seventh conductive member 44. The insulating layer 45 may be a layer of an inorganic insulating material.

The fourth conductive member 41 is provided between the first region 10a of the first chip 10 and the third region 20a of the second chip 20 and connects the first conductive member 11 of the first chip 10 and the first signal terminal 21a of the second chip 20. The fourth conductive member 41 extends along the Z-axis direction and is, for example, a metal via.

Many inter-chip interconnect connections are possible by arranging multiple fourth conductive members 41 in an array configuration in the X-Y plane.

The fifth conductive member 42 is provided between the second region 10b of the first chip 10 and the fifth region 30a of the third chip 30 and connects the first conductive member 11 of the first chip 10 and the second signal terminal 31a of the third chip 30. The fifth conductive member 42 extends along the Z-axis direction and is, for example, a metal via. Many inter-chip interconnect connections are possible by arranging multiple fifth conductive members 42 in an array configuration in the X-Y plane.

The sixth conductive member 43 is provided between the fourth region 20b of the second chip 20 and the first terminal 81 and connects the first power supply terminal 21b of the second chip 20 and the first terminal 81.

The seventh conductive member 44 is provided between the sixth region 30b of the third chip 30 and the second terminal 82 and connects the second power supply terminal 31b of the third chip 30 and the second terminal 82.

The sixth conductive member 43 and the seventh conductive member 44 are, for example, metal interconnects. The first terminals 81 and the second terminals 82 are external terminals connecting the electronic device 1 to an external circuit. The first terminals 81 and the second terminals 82 are, for example, solder balls. The first terminals 81 and the second terminals 82 may be metal pads or metal bumps.

The first chip 10 is provided between the first terminals 81 and the second terminals 82. The direction from the first terminals 81 toward the first chip 10 is aligned with the X-axis direction. The direction from the second terminals 82 toward the first chip 10 is aligned with the X-axis direction.

The resin portion 51 covers at least a portion of the side surfaces of the second chip 20 and the third chip 30. The side surfaces cross the X-Y plane. Although an embodiment is shown in the example shown in FIG. 1A in which the surfaces of the second chip 20 and the third chip 30 opposite to the interconnect layer 40 also are covered with the resin portion 51, the exposure from the resin portion 51 of the surfaces opposite to the interconnect layer 40 is arbitrary.

As shown in FIG. 1A, the resin portion 51 includes a first resin region 51a, a second resin region 51b, and a third resin region 51c. As shown in FIG. 2B, the resin portion 51 further includes a fourth resin region 51d and a fifth resin region 51e. The first to fifth resin regions 51a to 51e are continuous with each other.

Although a configuration is used in the example shown in FIG. 1A in which the resin portion 51 is disposed also at the peripheral portion of the second conductive member 21 and the peripheral portion of the third conductive member 31, the resin portion 51 may not be disposed at the peripheral portion of the second conductive member 21 and the peripheral portion of the third conductive member 31; for example, a different insulating material may be disposed at the peripheral portion of the second conductive member 21 and the peripheral portion of the third conductive member 31.

The second chip 20 is provided between the first resin region 51a and the third resin region 51c. The direction from the first resin region 51a toward the third resin region 51c is aligned with the X-axis direction. The third chip 30 is provided between the third resin region 51c and the second resin region 51b. The third resin region 51c is provided between the second chip 20 and the third chip 30. The direction from the third resin region 51c toward the second resin region 51b is aligned with the X-axis direction.

The second chip 20 is provided between the fourth resin region 51d and the fifth resin region 51e. The third chip 30 is provided between the fourth resin region 51d and the fifth resin region 51e. The direction from the fourth resin region 51d toward the fifth resin region 51e is aligned with the Y-axis direction.

The interconnect layer 40 is provided also between the first resin region 51a and the first terminals 81 and between the second resin region 51b and the second terminals 82.

The electronic device 1 according to the first embodiment further includes a fourth chip 70, an eighth conductive member 52, a ninth conductive member 53, and a semiconductor package device 60.

The fourth chip 70 includes, for example, an IPS (Integrated Passive Device) or a passive element. The passive element includes, for example, a discrete component such as a capacitor, an inductor, a resistance element, etc. For example, the fourth chip 70 is connected to the sixth conductive member 43.

The interconnect layer 40 is provided between the fourth chip 70 and the fourth region 20b of the second chip 20. The direction from the fourth chip 70 toward the second chip 20 is aligned with the Z-axis direction.

The fourth chip 70 is provided between the first terminals 81 and the first chip 10. The direction from the fourth chip 70 toward the first chip 10 is aligned with the X-axis direction.

The eighth conductive member 52 is, for example, a metal via having a columnar configuration extending in the Z-axis direction. The ninth conductive member 53 is, for example, a solder ball.

The semiconductor package device 60 includes, for example, a DRAM (Dynamic Random Access Memory) element or NVM (Non Volatile Memory) typified by flash memory, etc.

The eighth conductive member 52, the ninth conductive member 53, the second chip 20, the third chip 30, and the resin portion 51 are provided between the semiconductor package device 60 and the interconnect layer 40.

The ninth conductive member 53 is provided between the eighth conductive member 52 and the semiconductor package device 60 and is connected to the eighth conductive member 52 and the semiconductor package device 60.

The eighth conductive member 52 is provided between the interconnect layer 40 and the ninth conductive member 53. The eighth conductive member 52 is connected to the ninth conductive member 53 and to the sixth conductive member 43 and the seventh conductive member 44 of the interconnect layer 40.

As shown in FIG. 1A and FIG. 2A, the length along the X-axis direction of the first chip 10 is shorter than the length along the X-axis direction of the second chip 20 and the length along the X-axis direction of the third chip 30.

The first conductive member 11 of the first chip 10 is electrically connected to the first signal terminal 21a of the second chip 20 via the fourth conductive member 41. The first conductive member 11 of the first chip 10 is electrically connected to the second signal terminal 31a of the third chip 30 via the fifth conductive member 42. Accordingly, the first signal terminal 21a of the second chip 20 is electrically connected to the second signal terminal 31a of the third chip 30 via the fourth conductive member 41, the first conductive member 11 of the first chip 10, and the fifth conductive member 42.

A power supply is supplied to the first power supply terminal 21b of the second chip 20 via the first terminal 81 and the sixth conductive member 43 and supplied to the second power supply terminal 31b of the third chip 30 via the second terminal 82 and the seventh conductive member 44.

The fourth conductive member 41 and the sixth conductive member 43 are not connected to each other; and the fifth conductive member 42 and the seventh conductive member 44 are not connected to each other. Accordingly, the power supply is not supplied to the first chip 10; and the first chip 10 functions simply as an interconnect member connecting the second chip 20 and the third chip 30. The first chip 10 does not include a passive element or an active element such as a transistor, etc.

According to the electronic device 1 according to the first embodiment, the second chip 20 and the third chip 30 are connected to each other via the first chip 10. For example, a high-density fine interconnect can be formed in the first chip 10 at a low cost using a wafer process. It is unnecessary to form a high-density fine interconnect for the inter-chip connection in the interconnect layer 40 to which the second chip 20 and the third chip 30 are mounted; and the interconnect can be only an interconnect having a rough line-and-space formable at the panel level having a large surface area. This not only makes a cost reduction possible but also reduces the source impedance to the second chip 20 and the third chip 30 via the sixth conductive member 43 and the seventh conductive member 44 and contributes to the electrical power supply performance improvement.

Also, the first chip 10 can have a structure of only an interconnect that does not include an active element, a passive element, etc.; and the cost can be reduced drastically. Further, the chip size of the first chip 10 can be downsized by the amount that an element is not included; and a wide region where the first terminals 81 and the second terminals 82 are arranged can be ensured. This makes it possible to reduce the distance between the first power supply terminal 21b of the second chip 20 and the first terminal 81 and the distance between the second power supply terminal 31b of the third chip 30 and the second terminal 82; and the source impedances of the second chip 20 and the third chip 30 can be reduced. The decrease of the source impedance deters the fluctuation of the power supply voltage and makes stable operations possible.

The third chip 30 includes, for example, cache memory as a memory element. The semiconductor package device 60 may include, for example, DRAM as main memory having a larger memory capacity than the cache memory, or NVM (Non Volatile Memory) typified by flash memory or the like as storage memory. The second chip 20 can have a function of controlling the third chip 30 and the semiconductor package device 60.

According to such an embodiment, compared to a configuration in which the cache memory is internally integrated in the second chip 20, for example, cache memory that has a large capacity can be embedded as a system inside one package; the improvement of the system performance is realized; and a cost reduction of the inter-chip connection interconnect and high electrical power supply performance to each chip can be realized.

FIG. 3A to FIG. 6D are schematic cross-sectional views showing an example of the method for manufacturing the electronic device 1 according to the first embodiment.

Figure 3A:
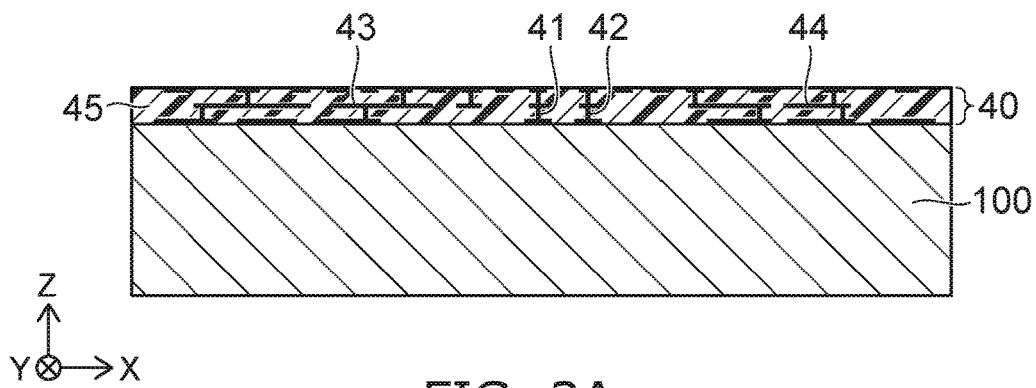
FIG. 3A to FIG. 6E are schematic cross-sectional views showing an example of a method for manufacturing the electronic device according to the first embodiment.

As shown in FIG. 3A, the interconnect layer 40 is formed on a supporter 100. The interconnect layer 40 includes the insulating layer 45, the fourth conductive member 41, the fifth conductive member 42, the sixth conductive member 43, and the seventh conductive member 44 described above.

For example, FIGS. 6A to 6D show processes of forming the fourth conductive member 41. The supporter 100 is not illustrated in FIGS. 6B to 6D.

Although a release layer also may be disposed between the interconnect layer 40 and the supporter 100, such a release layer is not illustrated. The release layer is a laminar material for providing the function of separating the interconnect layer 40 and the supporter 100 by applying mechanical stress and/or optical energy (laser irradiation, etc.).

After forming a pad 92 on the supporter 100, an insulating layer 91 that covers the pad 92 is formed. A hole 91a that reaches the pad 92 is formed in the insulating layer 91.

Figure 6A:
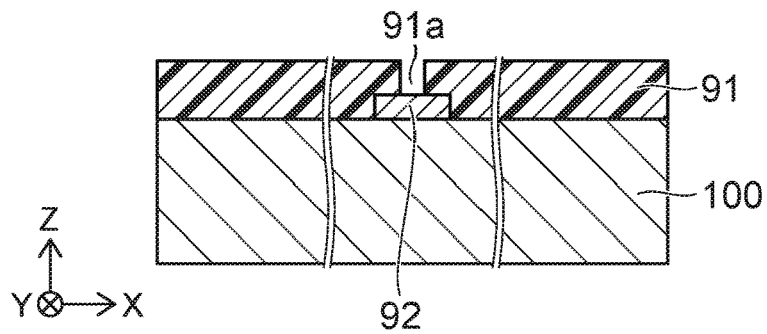
Figure 6B:
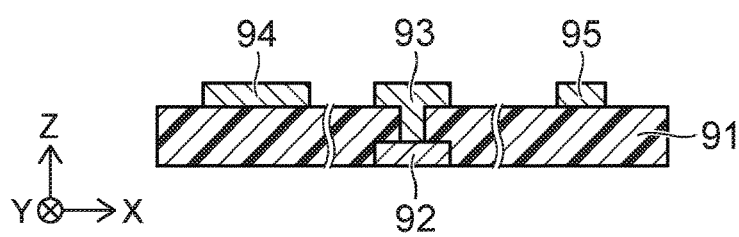

As shown in FIG. 6B, a via 93 is formed inside the hole 91a. The end portion of the via 93 is formed also on the insulating layer 91. A conductive layer 94 that is included in the sixth conductive member 43 and a conductive layer 95 that is included in the seventh conductive member 44 are formed on the insulating layer 91 simultaneously with the via 93.

Figure 6C:
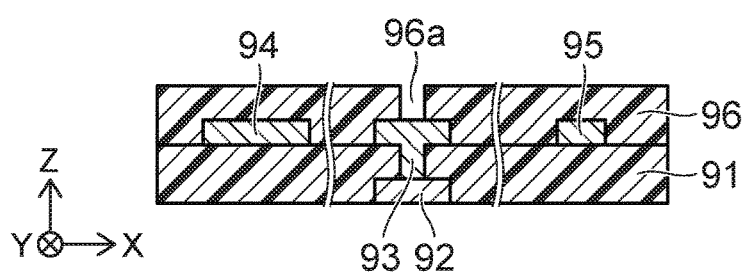
Figure 6D:
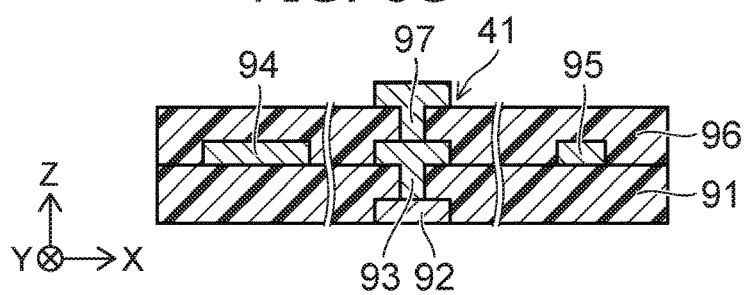

As shown in FIG. 6C, an insulating layer 96 is further stacked with the insulating layer 91. A hole 96a that reaches the end portion of the via 93 is formed in the insulating layer 96. As shown in FIG. 6D, a via 97 is formed inside the hole 96a. Subsequently, an insulating layer may be formed; a hole may be formed in the insulating layer; and a via may be formed inside the hole.

Figure 6E:
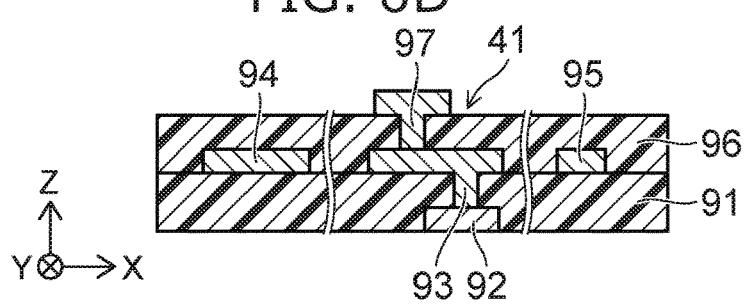

The fourth conductive member 41 that has a stacked via structure including the multiple vias 93 and 97 connected to each other in the Z-axis direction is formed by multiply repeating the process of forming the insulating layer, the process of forming the hole in the insulating layer, and the process of forming the via inside the hole. The fifth conductive member 42 that has the same stacked via structure also is formed similarly to the fourth conductive member 41. The via 93 and the via 97 are not limited to being arranged in linear configurations along the Z-axis direction; and the positions of the via 93 and the via 97 may be shifted in the X-axis direction (or the Y-axis direction) as shown in FIG. 6E.

Figure 3B:
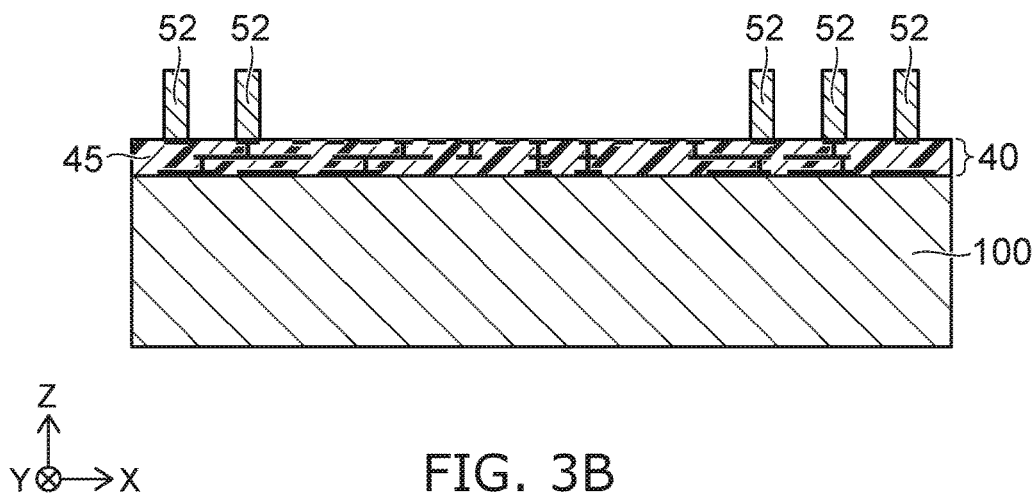
Figure 4A:
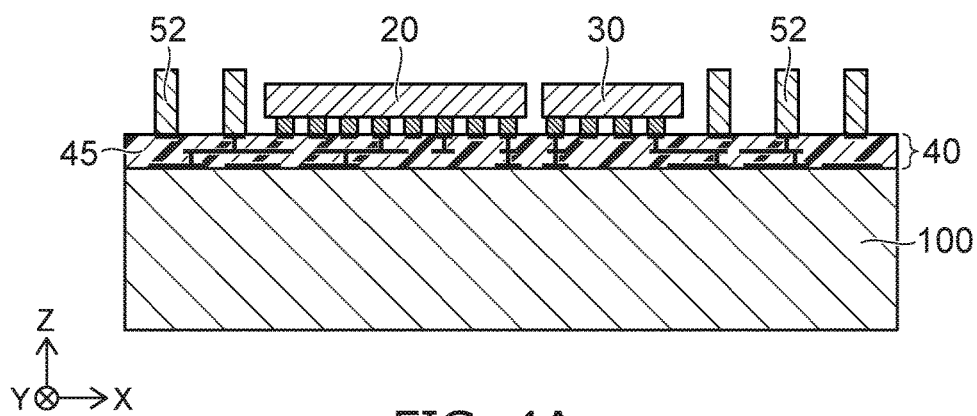

After forming the interconnect layer 40, the eighth conductive member 52 is fixed to the interconnect layer 40 as shown in FIG. 3B. Further, as shown in FIG. 4A, the second chip 20 and the third chip 30 are fixed to the interconnect layer 40. The second chip 20 and the third chip 30 may be fixed to the interconnect layer 40 before the eighth conductive member 52.

Figure 4B:
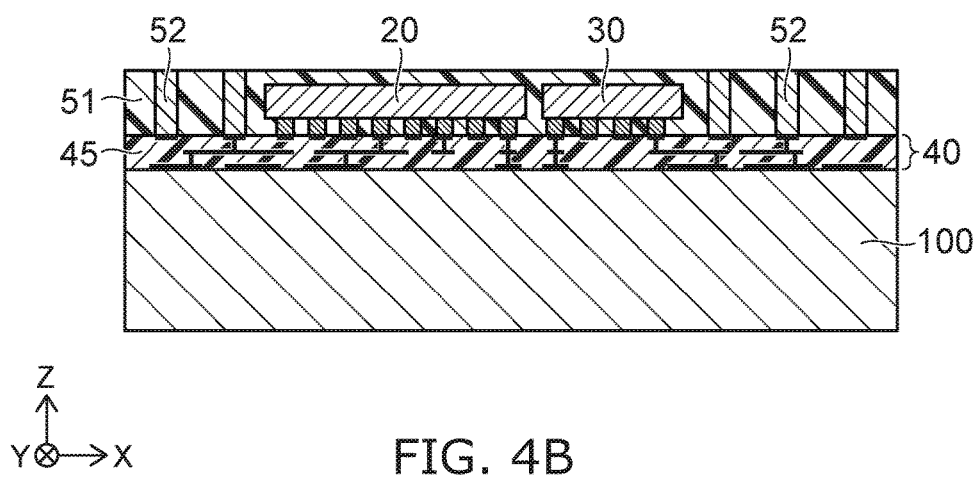

The eighth conductive member 52, the second chip 20, and the third chip 30 are covered with the resin portion 51 as shown in FIG. 4B. The resin portion 51 is stacked with the interconnect layer 40.

Figure 5A:
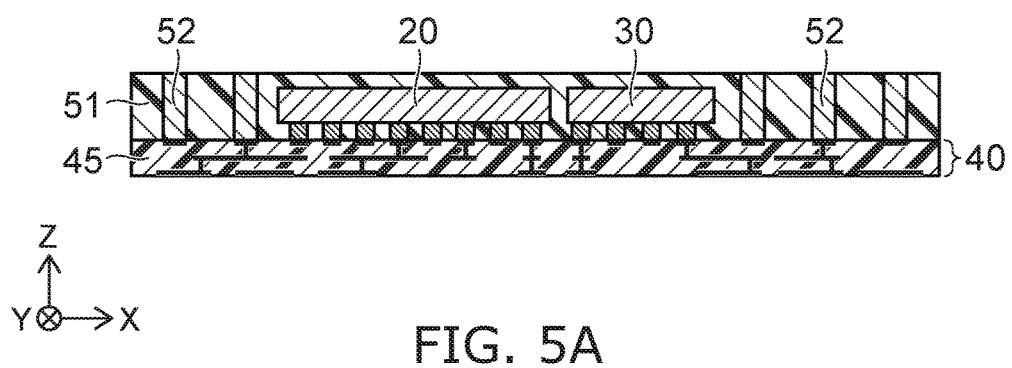

The supporter 100 is removed after forming the resin portion 51. The supporter 100 may be removed by utilizing the function provided by the release layer described above; or the supporter 100 may be removed by a method such as polishing, etching, etc. By these processes, the surface of the interconnect layer 40 that opposed the supporter 100 is exposed as shown in FIG. 5A.

Figure 5B:
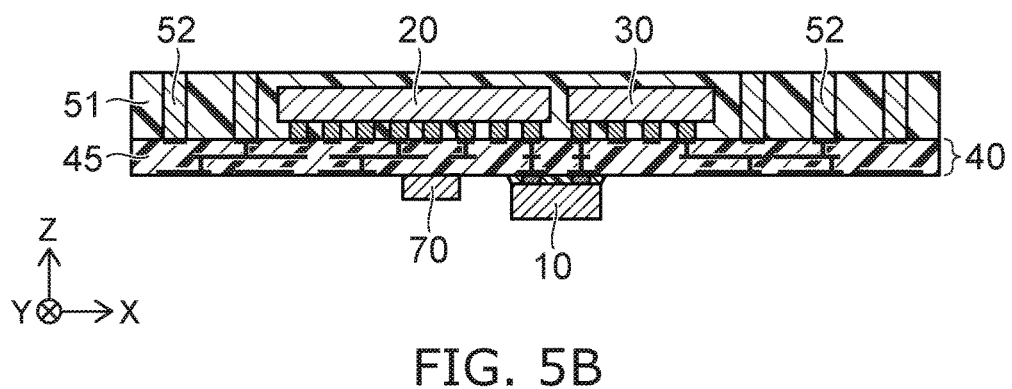

The first chip 10 and the fourth chip 70 are fixed to the exposed surface of the interconnect layer 40 as shown in FIG. 5B. After fixing the first chip 10 to the interconnect layer 40, the substrate 12 of the first chip 10 shown in FIG. 1B may be removed.

Subsequently, the first terminals 81 and the second terminals 82 shown in FIG. 1A are fixed to the interconnect layer 40; further, the semiconductor package device 60 is stacked. The order of stacking the semiconductor package device 60 may be after the first terminals 81 and the second terminals 82 are fixed.

Second Embodiment

Figure 7:
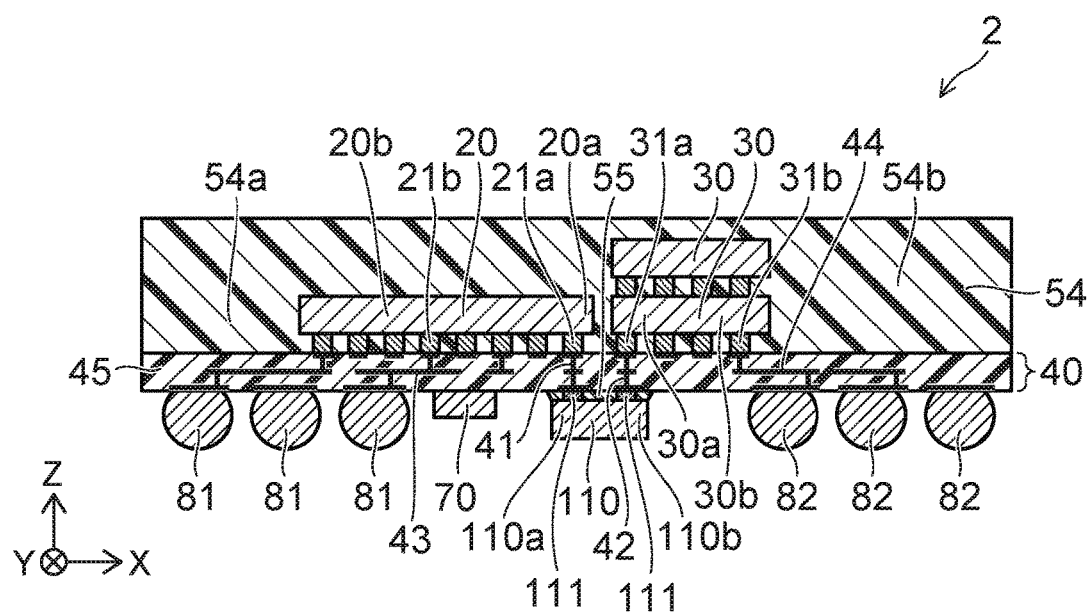
FIG. 7 is a schematic cross-sectional view illustrating an electronic device according to a second embodiment.

FIG. 7 is a schematic cross-sectional view illustrating an electronic device 2 according to a second embodiment.

Figure 8A:
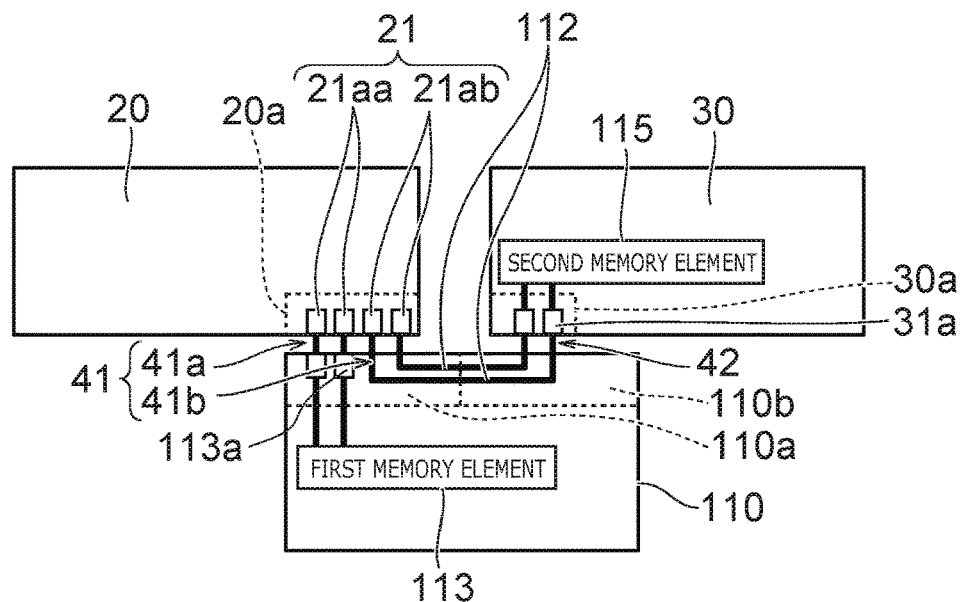
FIGS. 8A and 8B are schematic views showing a connectional relationship of a first chip, a second chip, and a third chip of the electronic device according to the second embodiment.
Figure 8B:
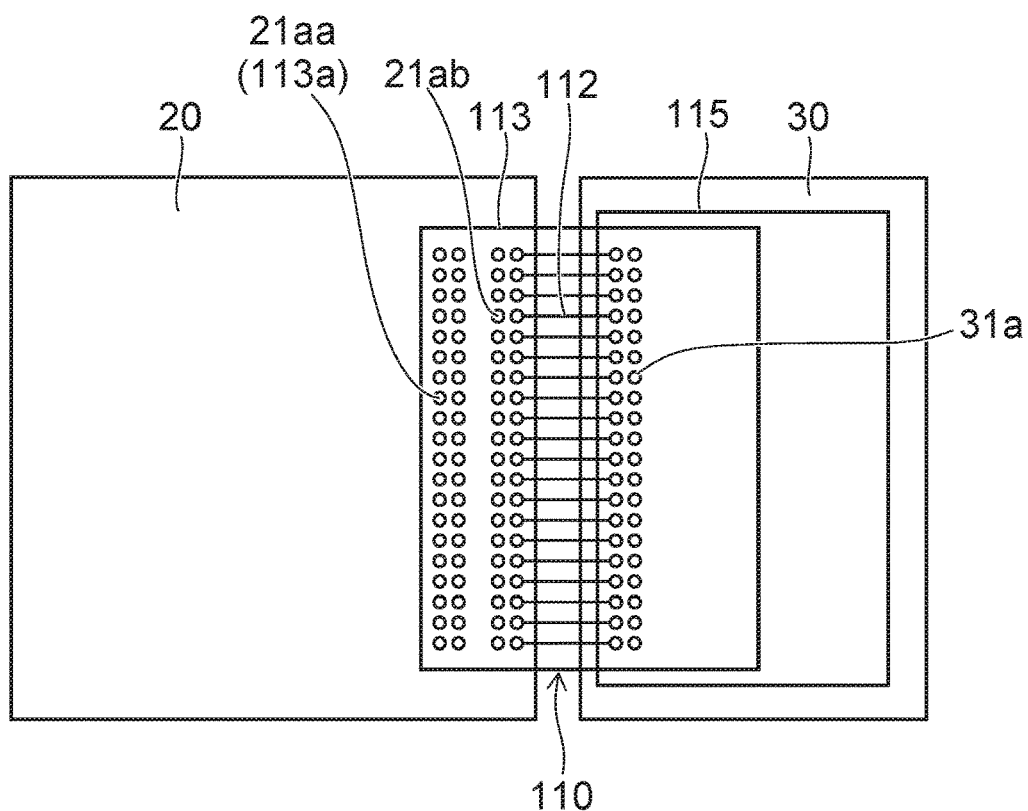

FIG. 8A is a schematic view showing the connectional relationship between a first chip 110, the second chip 20, and the third chip 30 of the electronic device 2. FIG. 8B is a schematic view in a plane illustrating the connectional relationship between the first chip 110, the second chip 20, and the third chip 30. As shown in FIG. 7, the electronic device 2 according to the second embodiment includes the interconnect layer 40, the first chip 110, the second chip 20, the third chip 30, the resin portion 51, the multiple first terminals 81, and the multiple second terminals 82.

The first chip 110 includes a first conductive member 111, a first region 110a, and a second region 110b. The direction from the first region 110a of the first chip 110 toward the third region 20a of the second chip 20 is aligned with the first direction. The direction from the second region 110b of the first chip 110 toward the fifth region 30a of the third chip 30 is aligned with the first direction.

The first region 110a of the first chip 110 faces the third region 20a of the second chip 20 and is a connection region connected to the third region 20a of the second chip 20. The third region 20a of the second chip 20 faces the first region 110a of the first chip 110 and is the region of the connection to the first region 110a of the first chip 110. The second region 110b of the first chip 110 faces the fifth region 30a of the third chip 30 and is a connection region connected to the fifth region 30a of the third chip 30. The fifth region 30a of the third chip 30 faces the second region 110b of the first chip 110 and is a connection region connected to the second region 110b of the first chip 110.

The direction from the first region 110a of the first chip 110 toward the fourth region 20b of the second chip 20 crosses the first direction and the second direction. The direction from the second region 110b of the first chip 110 toward the sixth region 30b of the third chip 30 crosses the first direction and the second direction.

The interconnect layer 40 is provided between the first region 110a of the first chip 110 and the third region 20a of the second chip 20, between the second region 110b of the first chip 110 and the fifth region 30a of the third chip 30, between the fourth region 20b of the second chip 20 and the first terminals 81, and between the sixth region 30b of the third chip 30 and the second terminals 82.

The fourth conductive member 41 of the interconnect layer 40 is provided between the first region 110a of the first chip 110 and the third region 20a of the second chip 20 and connects the first conductive member 111 of the first chip 110 and the signal terminal 21a of the second chip 20. Many inter-chip interconnect connections are possible by arranging multiple fourth conductive members 41 in an array configuration in the X-Y plane.

The fifth conductive member 42 of the interconnect layer 40 is provided between the second region 110b of the first chip 110 and the fifth region 30a of the third chip 30 and connects the first conductive member 111 of the first chip 110 and the fourth signal terminal 31a of the third chip 30. Many inter-chip interconnect connections are possible by arranging multiple fifth conductive members 42 in an array configuration in the X-Y plane.

The first chip 110 is provided between the first terminals 81 and the second terminals 82. The direction from the first terminals 81 toward the first chip 110 is aligned with the X-axis direction. The direction from the second terminals 82 toward the first chip 110 is aligned with the X-axis direction.

The length along the X-axis direction of the first chip 110 is shorter than the length along the X-axis direction of the second chip 20 and the length along the X-axis direction of the third chip 30.

Similarly to the first chip 10 of the first embodiment recited above, the first chip 110 includes the first conductive member 111 connecting between the second chip 20 and the third chip 30. As shown in FIG. 8A, the first chip 110 may further include a first memory element 113. The first memory element 113 is, for example, cache memory.

The third chip 30 includes a second memory element 115. The second memory element 115 is, for example, main memory and may be DRAM. In the case where the first chip 110 includes a first memory element 113, the memory capacity of the second memory element 115 is larger than the memory capacity of the first memory element 113.

An example is shown in FIG. 7 in which multiple third chips 30 are stacked in the Z-axis direction. The first memory element 113 has a faster operation speed than the second memory element 115. Various methods may be used as the connection method between the multiple third chips 30; and the connection method may be, for example, a TSV (Through Silicon Via) or a metal wire connection. Because the third chip 30 that includes the second memory element 115 is provided on the side opposite to the mounting surface of the electronic device 2 for the board, the stacking of the multiple third chips 30 is easy; and it is easy to increase the capacity of the second memory element 115.

The second chip 20 includes, for example, a logic element and controls the first memory element 113 of the first chip 110 and the second memory element 115 of the third chip 30. Or, the logic element of the second chip 20 may control only the second memory element 115 of the third chip 30. In the specification, "control" includes the mutual data transfer between the logic element and the memory element, the control of the mutual data transfer, the data movement inside the memory element, and the control of the data movement.

As shown in FIG. 8A, the first conductive member 111 of the first chip 110 includes multiple interconnects 112 connecting the second chip 20 and the third chip 30. The interconnects 112 are, for example, metal interconnects. Or, the interconnects 112 may be optical interconnects (or optical waveguides). The interconnects 112 function as buses for the data transfer from the second chip 20 to the third chip 30.

As shown in FIG. 8A and FIG. 8B, the second chip 20 includes multiple second signal terminals 21aa and multiple third signal terminals 21ab. The second signal terminals 21aa and the multiple third signal terminals 21ab are provided in the third region 20a of the second chip 20.

The first chip 110 includes multiple first signal terminals 113a electrically connected to the first memory element 113. The first signal terminals 113a are provided in the first region 110a of the first chip 110.

The fourth conductive member 41 of the interconnect layer 40 includes multiple metal vias 41a and multiple metal vias 41b. The metal vias 41a connects the second signal terminals 21aa of the second chip 20 and the first signal terminals 113a of the first chip 110. The metal vias 41b connects the third signal terminals 21ab of the second chip 20 and the interconnects 112.

The third chip 30 includes multiple fourth signal terminals 31a electrically connected to the second memory element 115. The fourth signal terminals 31a are provided in the fifth region 30a of the third chip 30. The fourth signal terminals 31a are connected to the interconnects 112 of the first chip 110.

The interconnects 112 of the first chip 110 connect the third signal terminals 21ab of the second chip 20 and the fourth signal terminals 31a of the third chip 30. The interconnects 112 are not connected to the sixth conductive member 43 and the seventh conductive member 44 of the interconnect layer 40 which are interconnects for connecting the first chip 110, the second chip 20, and the third chip 30 to the outside. For example, the interconnects of the interconnect layer 40 also are metal interconnects. Or, the interconnects of the interconnect layer 40 may be optical interconnects (or optical waveguides).

The connections between the second chip 20 and the first memory element 113 are via connections provided by the metal vias 41a without going through the interconnects 112.

A power supply is supplied to the first chip 110 including the first memory element 113. The first conductive member 111 of the first chip 110 shown in FIG. 7 is electrically connected to the first terminals 81 via the sixth conductive member 43. Or, the first conductive member 111 of the first chip 110 is electrically connected to the second terminals 82 via the seventh conductive member 44. The power supply also may be performed to the first chip 110 via the second chip 20 or the third chip 30.

The interconnects 112 that are provided in the first chip 110 are so-called on-chip interconnects formed by a semiconductor wafer process. Conversely, the sixth conductive member 43 and the seventh conductive member 44 which are interconnects of the interconnect layer 40 can be rough interconnects formed at the panel level which is larger than a semiconductor wafer. In other words, the minimum spacing of the interconnects 112 of the first chip 110 is smaller than the minimum spacing of the interconnects of the interconnect layer 40.

In the electronic device 2 according to the second embodiment as well, the second chip 20 and the third chip 30 are connected to each other via the first chip 110. For example, a high-density fine interconnect can be formed in the first chip 110 at a low cost using a wafer process. It is unnecessary to form a high-density fine interconnect for the inter-chip connection in the interconnect layer 40 to which the second chip 20 and the third chip 30 are mounted; and the interconnect can be only an interconnect having a rough line-and-space formable at the panel level. This makes a cost reduction possible.

The first chip 110 performs mainly the function of the inter-chip interconnect; and the chip size of the first chip 110 can be small. A wide region where the first terminals 81 and the second terminals 82 are disposed can be ensured by this amount. This makes it possible to reduce the distance between the first power supply terminal 21b of the second chip 20 and the first terminal 81 and the distance between the second power supply terminal 31b of the third chip 30 and the second terminal 82; and the source impedances of the second chip 20 and the third chip 30 can be reduced. The decrease of the source impedance deters the fluctuation of the power supply voltage and makes stable operations possible.

Also, according to the second embodiment, the first chip 110 not only may perform the inter-chip connection but also may have a memory function. According to such a second embodiment, the improvement of the system performance and the higher capacity by the increased layers of the memory layer structure are possible.

Third Embodiment

Figure 9:
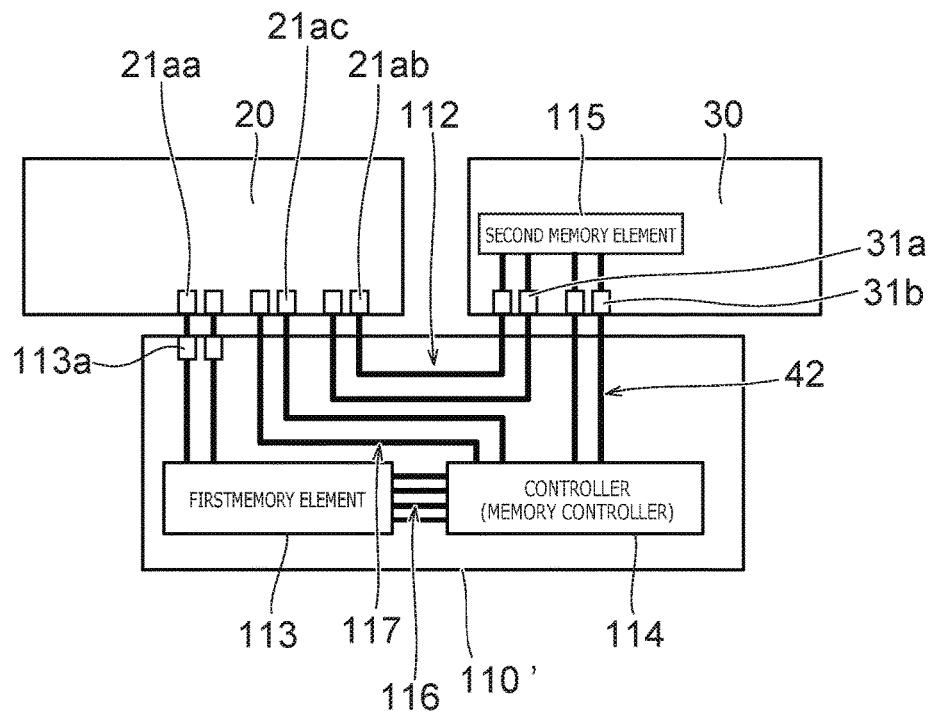
FIG. 9 is a schematic view showing a connectional relationship of a first chip, a second chip, and a third chip of an electronic device according to a third embodiment.

FIG. 9 is a schematic view showing the connectional relationship between a first chip 110', the second chip 20, and the third chip 30 of an electronic device according to a third embodiment.

The electronic device according to the third embodiment has the structure of the electronic device 2 according to the second embodiment shown in FIG. 7 in which the first chip 110 is replaced with the first chip 110'. In other words, the first chip 110' also includes the interconnects 112, the first region 110a, and the second region 110b similar to those of the first chip 110.

As shown in FIG. 9, the first chip 110' further includes the first memory element 113 and a controller 114. The first memory element 113 is, for example, cache memory. The first chip 110' includes multiple first signal terminals 113a electrically connected to the first memory element 113.

The third chip 30 includes the second memory element 115, the multiple fourth signal terminals 31a, and the multiple sixth signal terminals 31b. The multiple fourth signal terminals 31a and the multiple sixth signal terminals 31b are connected to the second memory element 115.

The second chip 20 includes the multiple second signal terminals 21aa, the multiple third signal terminals 21ab, and multiple fifth signal terminals 21ac.

The controller 114 of the first chip 110' is connected to the sixth signal terminals 31b of the third chip 30 via multiple metal vias 42. The controller 114 controls the second memory element 115 of the third chip 30. In other words, the first chip 110' has the function of controlling the second memory element 115 having the large capacity.

The controller 114 of the first chip 110' is connected to the first memory element 113 via multiple interconnects 116 inside the first chip 110' and controls the first memory element 113.

Also, the controller 114 of the first chip 110' is connected to the fifth signal terminals 21ac of the second chip 20 via interconnects 117 provided in the interconnect layer 40.

A power supply is supplied to the first chip 110' via the first terminals 81 and the sixth conductive member 43. Or, the power supply is supplied to the first chip 110' via the second terminals 82 and the seventh conductive member 44.

According to the configuration shown in FIG. 9, the controller 114 of the first chip 110' can control both the second memory element 115 of the third chip 30 and the first memory element 113 of the first chip 110'. This makes it possible to optimize the data placement of the memory layer structure without consuming the information processing time and the operating energy accompanying the control of both the first memory element 113 and the second memory element 115 of the logic element of the second chip 20. For example, in the case where the first memory element 113 is cache memory, the appropriate movement of the data necessary for the logic element of the second chip 20 from the second memory element 115 of the third chip 30 to the first memory element 113 is realizable without relying on the control of the second chip 20.

Fourth Embodiment

Figure 10:
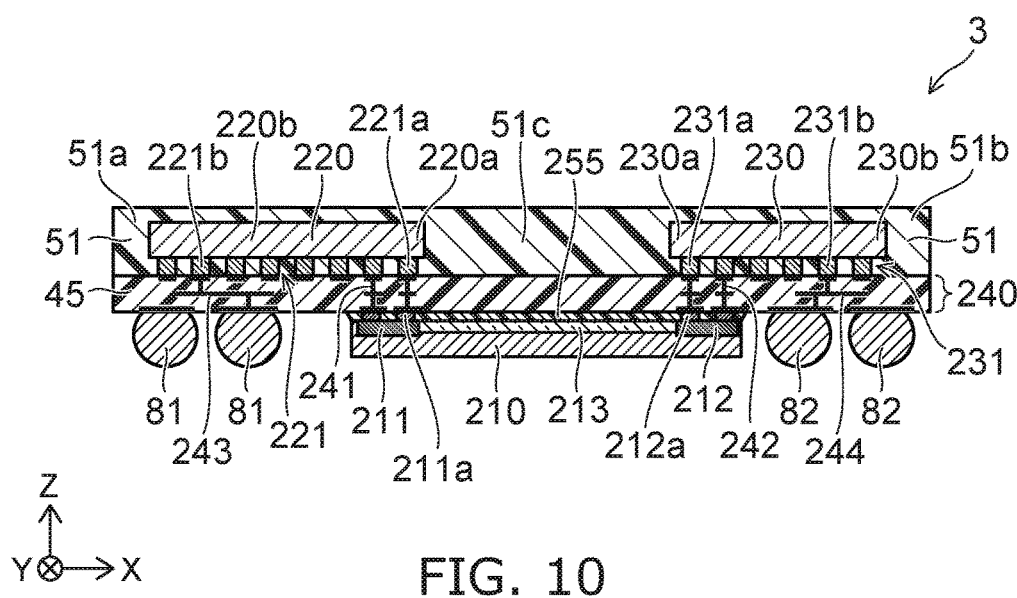
FIG. 10 is a schematic cross-sectional view illustrating an electronic device according to a fourth embodiment.

FIG. 10 is a schematic cross-sectional view illustrating an electronic device 3 according to a fourth embodiment.

The electronic device 3 according to the fourth embodiment includes an interconnect layer 240, a first chip 210, a second chip 220, a third chip 230, the resin portion 51, the multiple first terminals 81, and the multiple second terminals 82.

The first chip 210 includes a first optical element 211, a second optical element 212, and an optical waveguide 213. The first optical element 211 includes a first electrode terminal 211a; and the second optical element 212 includes a second electrode terminal 212a.

The first optical element 211 is, for example, a light-emitting element or a light receiving element. The second optical element 212 is, for example, a light-emitting element or a light receiving element. The optical waveguide 213 is provided between the first optical element 211 and the second optical element 212. The first optical element 211 and the second optical element 212 are optically coupled to the optical waveguide 213.

The second chip 220 includes a first region 220a and a second region 220b. The third chip 230 includes a third region 230a and a fourth region 230b.

The direction from the first optical element 211 of the first chip 210 toward the first region 220a of the second chip 20 is aligned with the first direction. The direction from the second optical element 212 of the first chip 210 toward the third region 230a of the third chip 30 is aligned with the first direction. The second direction from the second chip 220 toward the third chip 230 crosses the first direction. In the example, the second direction is aligned with the X-axis direction. The direction from the first optical element 211 toward the second optical element 212 is aligned with the second direction.

The direction from the first optical element 211 of the first chip 210 toward the second region 220b of the second chip 220 crosses the first direction and the second direction. The direction from the second optical element 212 of the first chip 210 toward the fourth region 230b of the third chip 230 crosses the first direction and the second direction.

The interconnect layer 240 is provided between the first optical element 211 of the first chip 210 and the first region 220a of the second chip 220, between the second optical element 212 of the first chip 210 and the third region 230a of the third chip 230, between the second region 220b of the second chip 220 and the first terminals 81, and between the fourth region 230b of the third chip 230 and the second terminals 82.

An insulating portion 255 is provided between the first chip 210 and the interconnect layer 240. For example, the insulating portion 255 is made of a resin material or an inorganic material. The insulating portion 255 covers the first electrode terminal 211a of the first optical element 211 and the second electrode terminal 212a of the second optical element 212. For example, the insulating portion 255 can be injected after connecting the first electrode terminal 211a and the second electrode terminal 212a to the interconnect layer 240. Or, a formation method may be used in which the insulating portion 255 is pre-formed in a region including the peripheries of the first electrode terminal 211a and the second electrode terminal 212a; and the insulating portion 255 is connected to the interconnect layer 240 simultaneously with the first electrode terminal 211a and the second electrode terminal 212a.

The second chip 220 includes a first conductive member 221. The first conductive member 221 is, for example, a metal member. The first conductive member 221 includes a first signal terminal 221a, a first power supply terminal 221b, and a conductive layer (not illustrated) connected to the first signal terminal 221a and the first power supply terminal 221b. The second chip 220 includes, for example, a logic element.

The third chip 230 includes a second conductive member 231. The second conductive member 231 is, for example, a metal member. The second conductive member 231 includes a second signal terminal 231a, a second power supply terminal 231b, and a conductive layer (not illustrated) connected to the second signal terminal 231a and the second power supply terminal 231b. The third chip 230 includes, for example, a memory element or a logic element.

The interconnect layer 240 includes the insulating layer 45, a third conductive member 241, a fourth conductive member 242, a fifth conductive member 243, and a sixth conductive member 244.

The insulating layer 45 is, for example, a resin layer. The insulating layer 45 is provided between the third conductive member 241, the fourth conductive member 242, the fifth conductive member 243, and the sixth conductive member 244.

The third conductive member 241 is provided between the first optical element 211 of the first chip 210 and the first region 220a of the second chip 220 and electrically connects the first electrode terminal 211a of the first optical element 211 and the first signal terminal 221a of the second chip 220. The third conductive member 241 is, for example, a metal via extending along the Z-axis direction. Many inter-chip interconnect connections are possible by arranging multiple third conductive members 241 in an array configuration in the X-Y plane.

The fourth conductive member 242 is provided between the second optical element 212 of the first chip 210 and the third region 230a of the third chip 230 and electrically connects the second electrode terminal 212a of the second optical element 212 and the second signal terminal 231a of the third chip 230. The fourth conductive member 242 extends along the Z-axis direction and is, for example, a metal via. Many inter-chip interconnect connections are possible by arranging multiple fourth conductive members 242 in an array configuration in the X-Y plane.

The fifth conductive member 243 is provided between the second region 220b of the second chip 220 and the first terminals 81 and connects the first power supply terminal 221b of the second chip 220 and the first terminals 81.

The sixth conductive member 244 is provided between the fourth region 230b of the third chip 230 and the second terminals 82 and connects the second power supply terminal 231*b* of the third chip 230 and the second terminals 82.

The first chip 210 is provided between the first terminals 81 and the second terminals 82. The direction from the first terminals 81 toward the first chip 210 is aligned with the X-axis direction. The direction from the second terminals 82 toward the first chip 210 is aligned with the X-axis direction.

The resin portion 51 covers the second chip 20 and the third chip 30. The resin portion 51 includes the first resin region 51*a*, the second resin region 51*b*, and the third resin region 51*c*. The second chip 220 is provided between the first resin region 51*a* and the third resin region 51*c*. The third chip 230 is provided between the third resin region 51*c* and the second resin region 51*b*. The third resin region 51*c* is provided between the second chip 220 and the third chip 230.

A power supply is supplied to the first power supply terminal 221*b* of the second chip 220 via the first terminals 81 and the fifth conductive member 243 and is supplied to the second power supply terminal 231*b* of the third chip 230 via the second terminals 82 and the sixth conductive member 244.

According to the electronic device 3 according to the fourth embodiment, the second chip 220 and the third chip 230 are connected to each other via the optical waveguide 213 that is formed in the first chip 210. The first optical element 211 converts an electrical signal from the second chip 220 into an optical signal and outputs the optical signal to the optical waveguide 213. Or, the first optical element 211 converts an optical signal from the optical waveguide 213 into an electrical signal and outputs the electrical signal to the second chip 220. The second optical element 212 converts an electrical signal from the third chip 230 into an optical signal and outputs the optical signal to the optical waveguide 213. Or, the second optical element 212 converts an optical signal from the optical waveguide 213 into an electrical signal and outputs the electrical signal to the third chip 230.

According to such a fourth embodiment, high-speed signal transmission in a wide bandwidth is possible by using optical interconnects as a portion of the interconnects between the second chip 220 and the third chip 230. It is unnecessary to form a high-density fine conductor interconnect and/or an optical waveguide for the inter-chip connection in the interconnect layer 240 in which the second chip 220 and the third chip 230 are mounted; and the interconnect can be only a rough interconnect formable at the panel level having a large surface area. This makes thermal isolation between the second chip 220 and the third chip 230 possible by using an optical waveguide in which a cost reduction, high-speed inter-chip communication, and signal transmission with low loss even over long distances are possible.

Fifth Embodiment

Figure 11A:
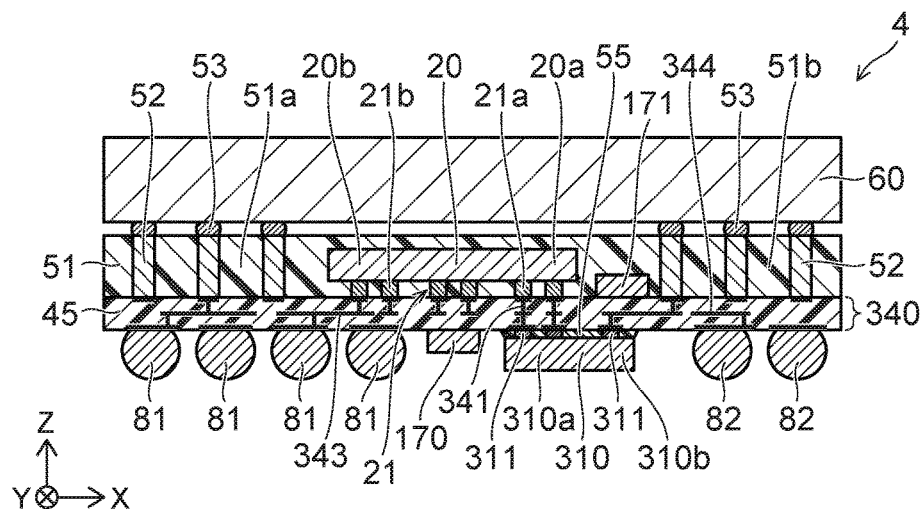
FIG. 11A is a schematic cross-sectional view illustrating an electronic device according to a fifth embodiment.

FIG. 11A is a schematic cross-sectional view illustrating an electronic device 4 according to a fifth embodiment.

Figure 12:
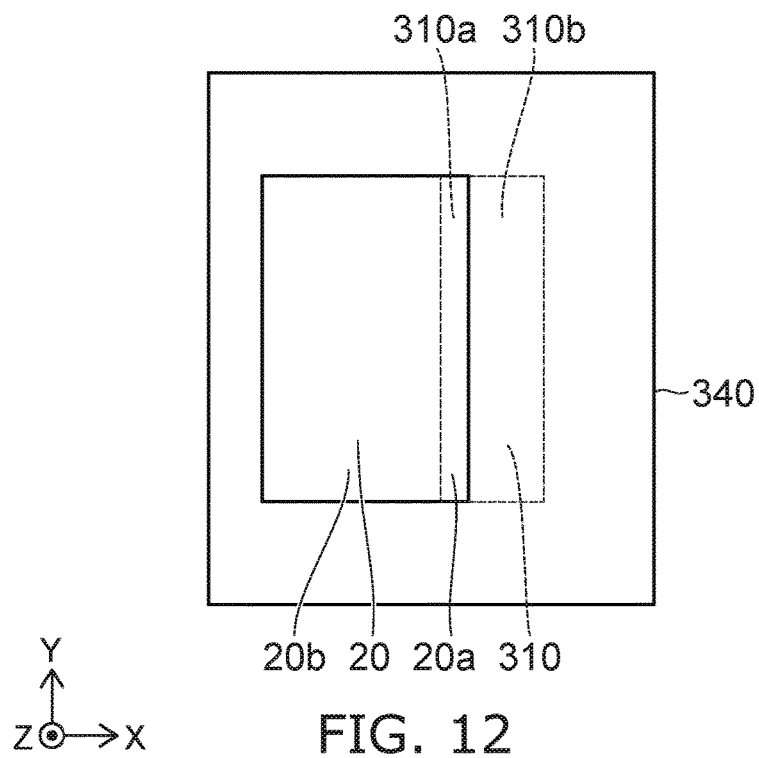
FIG. 12 is a schematic plan view showing an arrangement example of a first chip and a second chip of the electronic device according to the fifth embodiment.

FIG. 12 is a schematic plan view showing an arrangement example of a first chip 310 and the second chip 20 of the electronic device 4.

As shown in FIG. 11A, the electronic device 4 according to the fifth embodiment includes a first interconnect layer 340, the first chip 310, the second chip 20, the resin portion 51, the multiple first terminals 81, and the multiple second terminals 82.

The first chip 310 includes a first region 310*a* and a second region 310*b*. The second chip 20 includes the third region 20*a* and the fourth region 20*b*.

The first chip 310 includes, for example, a memory element. The memory element is, for example, cache memory. The second chip 20 includes, for example, a logic element.

The direction from the first region 310*a* of the first chip 310 toward the third region 20*a* of the second chip 20 is aligned with the first direction. The first direction is aligned with the X-axis direction. The second direction crosses the first direction. In the example, the second direction is orthogonal to the first direction and is aligned with the Y-axis direction.

The direction from the first region 310*a* of the first chip 310 toward the fourth region 20*b* of the second chip 20 crosses the first direction and the second direction. The direction from the second region 310*b* of the first chip 310 toward the third region 20*a* of the second chip 20 crosses the first direction and the second direction.

The resin portion 51 covers at least a portion of the side surface of the second chip 20. The resin portion 51 includes the first resin region 51*a* and the second resin region 51*b*. The second chip 20 is provided between the first resin region 51*a* and the second resin region 51*b*. Although the embodiment is shown in the example shown in FIG. 11A in which the surface of the second chip 20 opposite to the interconnect layer 340 also is covered with the resin portion 51, the exposure from the resin portion 51 of the surface opposite to the interconnect layer 340 is arbitrary. Also, although the configuration in the example shown in FIG. 11A includes the resin portion 51 disposed also at the peripheral portion of the second conductive member 21, the resin portion 51 may not be at the peripheral portion of the second conductive member 21; for example, a different insulating material may be at the peripheral portion of the second conductive member 21.

The first interconnect layer 340 is provided between the first region 310*a* of the first chip 310 and the third region 20*a* of the second chip 20, between the second region 310*b* of the first chip 310 and the second resin region 51*b*, between the fourth region 20*b* of the second chip 20 and the first terminals 81, between the first resin region 51*a* and the first terminals 81, and between the second resin region 51*b* and the second terminals 82.

The first chip 310 includes a first conductive member 311. The first conductive member 311 is, for example, a metal member and includes an electrode terminal and a conductive layer.

The insulating portion 55 is provided between the first chip 310 and the first interconnect layer 340. For example, the insulating portion 55 is made of a resin material or an inorganic material. For example, the insulating portion 55 can be injected after connecting the first conductive member 311 to the first interconnect layer 340. Or, a formation method may be used in which the insulating portion 55 is pre-formed in a region including the periphery of the first conductive member 311; and the insulating portion 55 is connected to the first interconnect layer 340 simultaneously with the first conductive member 311.

The second chip 20 includes the second conductive member 21. The second conductive member 21 is, for example, a metal member. The second conductive member 21 includes the first signal terminal 21*a*, the first power supply terminal 21*b*, and a conductive layer (not illustrated) connected to the first signal terminal 21*a* and the first power supply terminal 21*b*.

The first interconnect layer 340 includes the insulating layer 45, a third conductive member 341, a fourth conductive member 343, and a sixth conductive member 344.

The insulating layer 45 is, for example, a resin layer. The insulating layer 45 is provided between the third conductive member 341, the fourth conductive member 343, and the sixth conductive member 344. The insulating layer 45 may be an inorganic insulating material.

The third conductive member 341 is provided between the first region 310a of the first chip 310 and the third region 20a of the second chip 20 and connects the first conductive member 311 of the first chip 310 and the first signal terminal 21a of the second chip 20. The third conductive member 341 extends along the Z-axis direction and is, for example, a metal via. Many inter-chip interconnect connections are possible by arranging the multiple third conductive members 341 in an array configuration in the X-Y plane.

The fourth conductive member 343 is provided between the fourth region 20b of the second chip 20 and the first terminals 81 and connects the first power supply terminal 21b of the second chip 20 and the first terminals 81.

The sixth conductive member 344 connects the first conductive member 311 of the first chip 310 and the second terminals 82.

The first chip 310 is provided between the first terminals 81 and the second terminals 82. The direction from the first terminals 81 toward the first chip 310 is aligned with the X-axis direction. The direction from the second terminals 82 toward the first chip 310 is aligned with the X-axis direction.

The first interconnect layer 340 is provided also between the first resin region 51a and the first terminals 81 and between the second resin region 51b and the second terminals 82.

Similarly to the electronic device 1 of the first embodiment shown in FIG. 1A described above, the electronic device 4 according to the fifth embodiment further includes the eighth conductive member 52, the ninth conductive member 53, and the semiconductor package device 60.

The electronic device 4 further includes a third chip 170 and a fourth chip 171. The third chip 170 and the fourth chip 171 include, for example, an IPD (Integrated Passive Device) or a passive element. The passive element includes, for example, a discrete component such as a capacitor, an inductor, a resistance element, etc.

For example, the third chip 170 is connected to the third conductive member 343; and, for example, the fourth chip 171 is connected to the sixth conductive member 344.

The first interconnect layer 340 is provided between the fourth region 20b of the second chip 20 and the third chip 170. The third chip 170 is provided between the first terminals 81 and the first chip 310.

The first interconnect layer 340 is provided between the fourth chip 171 and the second region 310b of the first chip 310. The fourth chip 171 is covered with the second resin region 51b.

As shown in FIG. 11A and FIG. 12, the length along the X-axis direction of the first chip 310 may be shorter than the length along the X-axis direction of the second chip 20.

The first conductive member 311 of the first chip 310 is electrically connected to the first signal terminal 21a of the second chip 20 via the third conductive member 341.

The power supply is supplied to the first power supply terminal 21b of the second chip 20 via the first terminals 81 and the fourth conductive member 343. Also, the power supply is supplied to the first chip 310 via the second terminals 82 and the sixth conductive member 344.

According to the electronic device 4 according to the fifth embodiment, the first chip 310 and the second chip 20 can be connected to each other not by an interconnect extending in a direction along the X-Y plane but by the third conductive member 341 having a via configuration extending in the Z-axis direction. It is unnecessary to form a high-density fine interconnect for the inter-chip connection in the first interconnect layer 340; and the interconnect may be only an interconnect having a rough line-and-space formable at the panel level having a large surface area. This makes a cost reduction possible.

For example, the first region 310a of the first chip 310 including the memory element is substantially the memory interface region; and the first region 310a opposes the second chip 20 with the first interconnect layer 40 interposed in the Z-axis direction. The first chip 310 includes the second region 310b that does not oppose the second chip 20.

Such a chip layout makes it possible to widen the region where the first terminals 81 are disposed and to reduce the distance between the first terminals 81 and the first power supply terminal 21b formed in the fourth region 20b of the second chip 20. This reduces the source impedance of the second chip 20. The decrease of the source impedance deters the fluctuation of the power supply voltage and makes stable operations possible.

The first chip 310 includes, for example, cache memory as a memory element. The semiconductor package device 60 includes, for example, DRAM as main memory having a larger memory capacity than the cache memory. The second chip 20 controls the first chip 310 and the semiconductor package device 60.

In such a configuration, compared to a configuration in which the cache memory is internally integrated in the second chip 20, cache memory that has a large capacity can be embedded as a system inside one package; the improvement of the system performance can be realized; and a cost reduction of the inter-chip connection interconnect and stable electrical power supply to the chips can be realized.

Figure 11B:
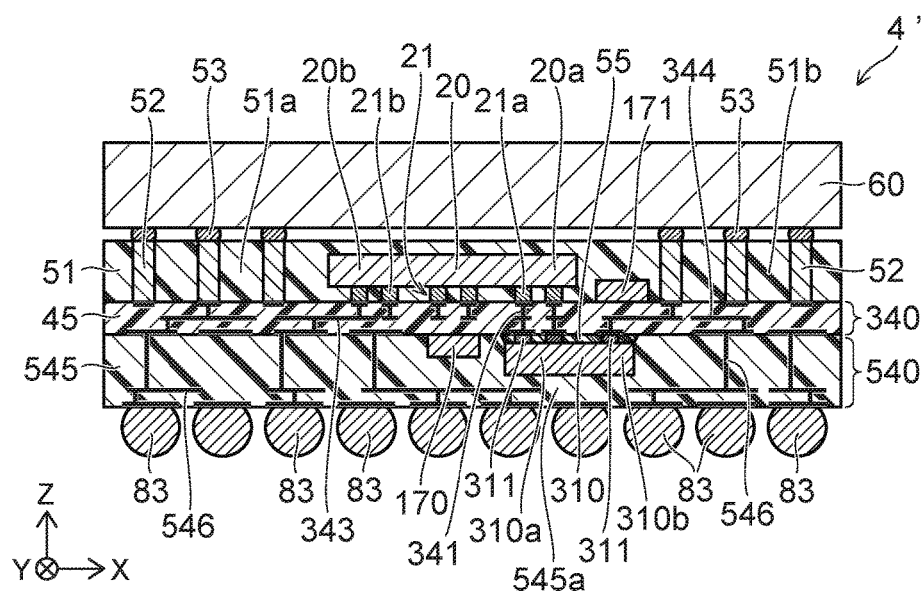
FIG. 11B is a schematic cross-sectional view illustrating another example of the electronic device according to the fifth embodiment.

FIG. 11B is a schematic cross-sectional view of an electronic device 4' of another example of the fifth embodiment.

Compared to the electronic device 4 of FIG. 11A, the electronic device 4' further includes a second interconnect layer 540. The second interconnect layer 540 is provided between the first interconnect layer 340 and multiple terminals 83. The first interconnect layer 340 is provided between the second interconnect layer 540 and the resin portion 51.

The terminals 83 are external terminals that connect the electronic device 4' to an external circuit. The terminals 83 are, for example, solder balls. The terminals 83 may be metal pads or metal bumps.

The second interconnect layer 540 includes an insulating layer 545 and a fifth conductive member 546.

The insulating layer 545 is, for example, a resin layer. The insulating layer 545 covers the first chip 310 and the third chip 170.

The fifth conductive member 546 is, for example, a metal member and is connected to the fourth conductive member 343 and the sixth conductive member 344 of the first interconnect layer 340 and to the terminals 83.

The insulating layer 545 includes an insulating portion 545a provided between the first chip 310 and the terminals 83. The first chip 310 is provided between the insulating portion 545a and the first interconnect layer 340.

The power supply is supplied to the second chip 20 via the terminals 83, the fifth conductive member 546 of the second interconnect layer 540, and the fourth conductive member 343 of the first interconnect layer 340.

The power supply is supplied to the first chip 310 via the terminals 83, the fifth conductive member 546 of the second interconnect layer 540, and the sixth conductive member 344 of the first interconnect layer 340.

The multiple terminals 83 can be arranged over a wide region of the second interconnect layer 540 without constraints due to the arrangement position of the first chip 310. This makes it possible to accommodate the increase of the number of external input/output terminals accompanying the expanded function of the electronic device 4'.

Sixth Embodiment

Figure 13:
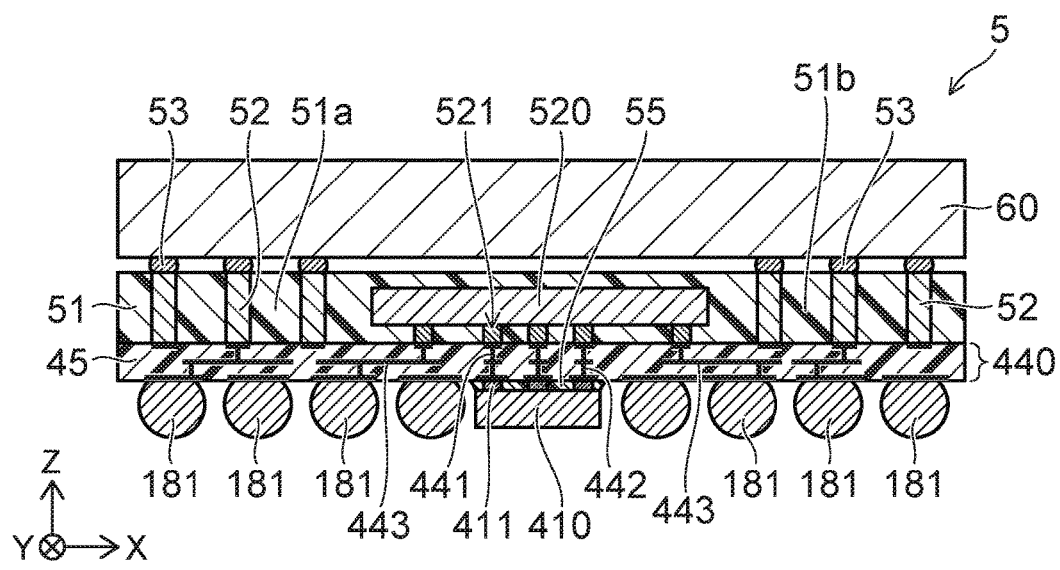
FIG. 13 is a schematic cross-sectional view illustrating an electronic device according to a sixth embodiment.

FIG. 13 is a schematic cross-sectional view illustrating an electronic device 5 according to a sixth embodiment.

Figure 14:
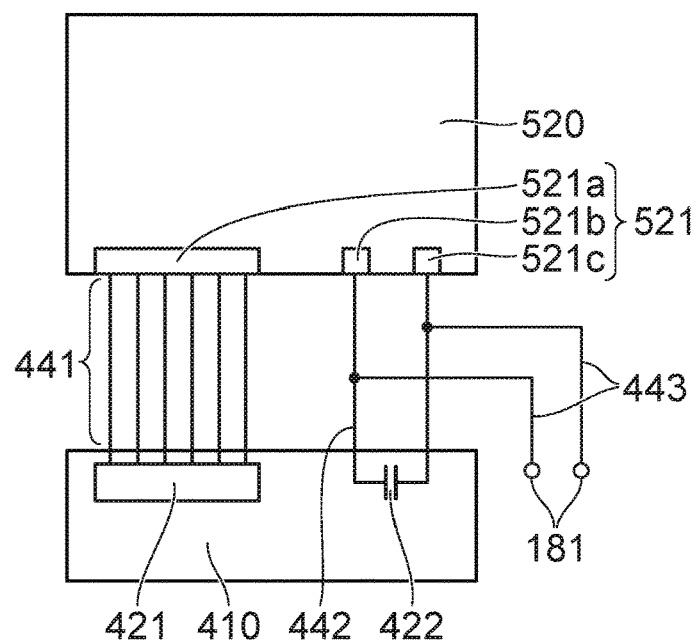
FIG. 14 is a schematic view showing a connectional relationship of a first chip and a second chip of the electronic device according to the sixth embodiment.

FIG. 14 is a schematic view showing the connectional relationship between a first chip 410 and a second chip 520 of the electronic device 5.

As shown in FIG. 13, the electronic device 5 according to the sixth embodiment includes an interconnect layer 440, the first chip 410, the second chip 520, the resin portion 51, and multiple third terminals 181.

The first chip 410 includes a conductive member 411; and the second chip 520 includes a conductive member 521. The conductive member 411 and the conductive member 521 are, for example, metal members.

The resin portion 51 covers at least a portion of the side surface of the second chip 520. The side surface crosses the X-Y plane. The resin portion 51 includes the first resin region 51a and the second resin region 51b. The second chip 520 is provided between the first resin region 51a and the second resin region 51b. Although an embodiment is shown in the example shown in FIG. 13 in which the surface of the second chip 520 opposite to the interconnect layer 440 also is covered with the resin portion 51, the exposure from the resin portion 51 of the surface opposite to the interconnect layer 440 is arbitrary. Also, although the configuration in the example shown in FIG. 13 includes the resin portion 51 disposed also at the peripheral portion of the second conductive member 521, the resin portion 51 may not be at the peripheral portion of the second conductive member 521; and, for example, a different insulating material may be at the peripheral portion of the second conductive member 521.

The interconnect layer 440 is provided between the first chip 410 and the second chip 520, between the third terminals 181 and the second chip 520, between the first resin region 51a and the third terminals 181, and between the second resin region 51b and the third terminals 181.

The insulating portion 55 is provided between the first chip 410 and the interconnect layer 440. For example, the insulating portion 55 is made of a resin material or an inorganic material. For example, the insulating portion 55 can be injected after connecting the first conductive member 411 to the interconnect layer 440. Or, a formation method may be used in which the insulating portion 55 is pre-formed in a region including the periphery of the first conductive member 411; and the insulating portion 55 is connected to the interconnect layer 440 simultaneously with the first conductive member 411.

The interconnect layer 440 includes the insulating layer 45, a first conductive member 441, a second conductive member 442, and a third conductive member 443.

The insulating layer 45 is, for example, a resin layer. The insulating layer 45 is provided between the first conductive member 441, the second conductive member 442, and the third conductive member 443.

The conductive member 411 of the first chip 410 is electrically connected to the conductive member 521 of the second chip 520 via the first conductive member 441 and the second conductive member 442.

The third terminals 181 are external terminals connecting the electronic device 5 to an external circuit. The third terminals 181 are, for example, solder balls. The third terminals 181 may be metal pads or metal bumps.

The first chip 410 is provided between the multiple third terminals 181.

The length along the X-axis direction of the first chip 410 is shorter than the length along the X-axis direction of the second chip 520.

The interconnect layer 440 is provided also between the first resin region 51a and the third terminals 181 and between the second resin region 51b and the third terminals 181.

Similarly to the electronic device 1 of the first embodiment shown in FIG. 1A described above, the electronic device 5 according to the sixth embodiment further includes the eighth conductive member 52, the ninth conductive member 53, and the semiconductor package device 60.

As shown in FIG. 14, the first chip 410 includes a memory element 421 and a first capacitor 422.

Figure 15:
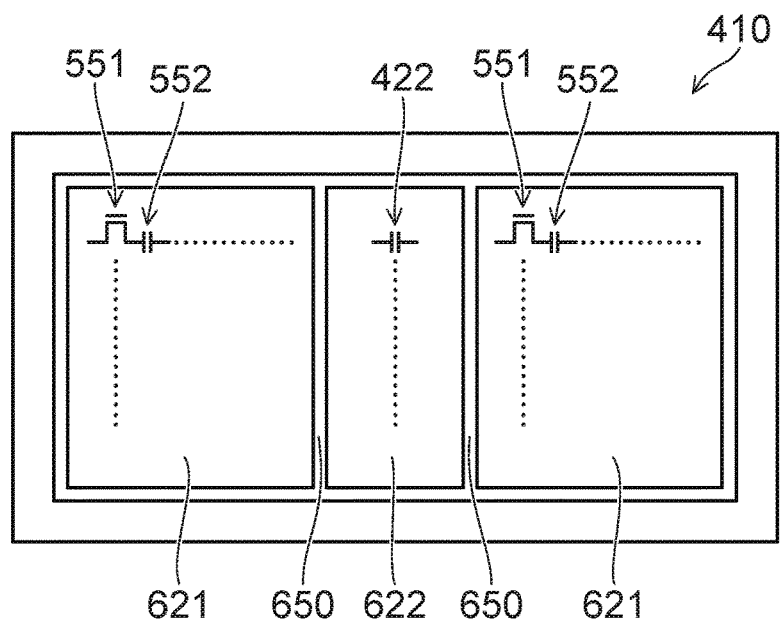
FIG. 15 is a schematic plan view showing a composition of the first chip of the electronic device according to the sixth embodiment.

FIG. 15 is a schematic plan view showing the arrangement of a first element region 621 where the memory element 421 is disposed and a second element region 622 where the first capacitor 422 is disposed in the first chip 410.

The memory element 421 is, for example, DRAM. The DRAM includes a transistor 551 and a second capacitor 552.

The first capacitor 422 has the same structure as the second capacitor 552 of the DRAM (e.g., a stacked capacitor, a trench capacitor, etc.).

In the example shown in FIG. 15, the second element region 622 is disposed between two first element regions 621. An insulating separation portion 650 is provided between the first element region 621 and the second element region 622. The insulating separation portion 650 is, for example, STI (Shallow Trench Isolation).

The insulating separation portion 650 interrupts the connection between the memory element 421 and the first capacitor 422. The memory element 421 and the first capacitor 422 are connected neither physically nor electrically.

The second chip 520 includes, for example, a logic element controlling the memory element 421 of the first chip 410. As shown in FIG. 14, the conductive member 521 of the second chip 520 includes a first terminal 521a, a second terminal 521b, and a fourth terminal 521c.

The first terminal 521a is a signal terminal; the second terminal 521b is a power supply terminal; and the fourth terminal 521c is a ground terminal.

The conductive member 411 of the first chip 410 includes an electrode of the memory element 421 and an electrode of the first capacitor 422.

The memory element 421 of the first chip 410 is electrically connected to the first terminal 521a of the second chip 520 via the first conductive member 441 of the interconnect layer 440.

The first capacitor 422 of the first chip 410 is electrically connected to the second terminal 521b and the fourth terminal 521c of the second chip 520 via the second conductive member 442 of the interconnect layer 440.

The first capacitor 422 of the first chip 410 and the second terminal 521b and the fourth terminal 521c of the second chip 520 are electrically connected to the third terminals 181 via the third conductive member 443 of the interconnect layer 440.

According to the electronic device 5 according to the sixth embodiment, the first chip 410 and the second chip 520 can be connected to each other not by an interconnect extending in a direction along the X-Y plane but by the first conductive member 441 and the second conductive member 442 having via configurations extending in the Z-axis direction. It is unnecessary to form a high-density fine interconnect for the inter-chip connection in the interconnect layer 440; and the interconnect can be only an interconnect having a rough line-and-space formable at the panel level having a large surface area. This makes a cost reduction possible.

In the first chip 410, the first capacitor 422 that is integrated with the memory element 421 is, for example, a decoupling capacitor connected to the power supply line of the second chip 520 and suppresses the fluctuation of the power supply voltage of the second chip 520. This makes stable operations of the second chip 520 possible.

Figure 16A:
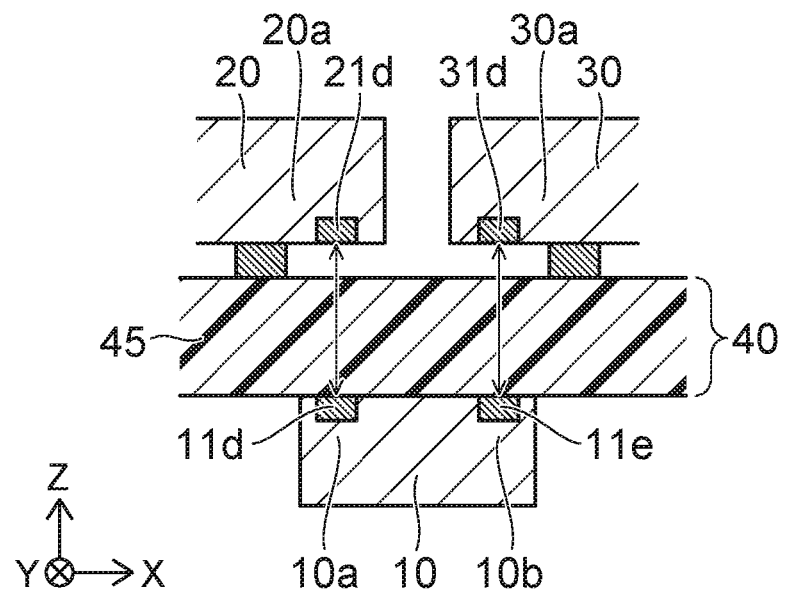
FIG. 16A is a schematic view showing a connectional relationship of a first chip, a second chip, and a third chip of an electronic device according to a seventh embodiment.

FIG. 16A is a schematic cross-sectional view showing the connectional relationship between the first chip 10, the second chip 20, and the third chip 30 of an electronic device according to a seventh embodiment.

The electronic device according to the seventh embodiment has the structure of the electronic device 1 shown in FIG. 1A in which the signal transfer portion between the first chip 10 and the second chip 20 and the signal transfer portion between the first chip 10 and the third chip 30 are not the conductive members 41 and 42, which are replaced with an inductive coupling pair or a capacitive coupling pair.

The first chip 10 includes a first coupling element 11d provided in the first region 10a, and a second coupling element 11e provided in the second region 10b. The second chip 20 includes a third coupling element 21d provided in the third region 20a. The third chip 30 includes a fourth coupling element 31d provided in the fifth region 30a.

The insulating layer 45 of the interconnect layer 40 is provided between the first coupling element 11d and the third coupling element 21d and between the second coupling element 11e and the fourth coupling element 31d. The conductive members of the interconnect layer 40 between the first coupling element 11d and the third coupling element 21d and between the second coupling element 11e and the fourth coupling element 31d may not be provided.

The direction from the first coupling element 11d toward the third coupling element 21d is aligned with the Z-axis direction; and the direction from the second coupling element 11e toward the fourth coupling element 31d is aligned with the Z-axis direction. The direction from the first coupling element 11d toward the second coupling element 11e is aligned with the X-axis direction; and the direction from the third coupling element 21d toward the fourth coupling element 31d is aligned with the X-axis direction.

For example, the first chip 10 can be fixed to the interconnect layer 40 by a bonding agent. Or, the first chip 10 can be directly coupled to the interconnect layer 40 by utilizing a dehydrating condensation reaction.

The first coupling element 11d, the second coupling element 11e, the third coupling element 21d, and the fourth coupling element 31d are inductive coupling elements or capacitive coupling elements.

The first coupling element 11d of the first chip 10 and the third coupling element 21d of the second chip 20 have inductive coupling or capacitive coupling. The second coupling element 11e of the first chip 10 and the fourth coupling element 31d of the third chip 30 have inductive coupling or capacitive coupling.

Similarly to the first chip 10 of the first embodiment shown in FIG. 1D, the first chip 10 further includes the conductive layer 11b. The conductive layer 11b electrically connects between the first coupling element 11d and the second coupling element 11e.

Signals are transmitted between the second chip 20 and the third chip 30 via the inductive coupling or the capacitive coupling between the first coupling element 11d and the third coupling element 21d, via the conductive layer 11b of the first chip 10, and via the inductive coupling or the capacitive coupling between the second coupling element 11e and the fourth coupling element 31d.

The seventh embodiment may include the following configuration:

an electronic device, including:
  a first chip including a first coupling element, a second coupling element, and a first conductive member;
  a second chip including a third coupling element;
  a third chip including a fourth coupling element; and
  an insulating layer provided between the first coupling element and the third coupling element and between the second coupling element and the fourth coupling element,
the first coupling element and the third coupling element having inductive coupling or capacitive coupling, the second coupling element and the fourth coupling element having inductive coupling or capacitive coupling,
the first conductive member electrically connecting the first coupling element and the second coupling element.

Figure 16B:
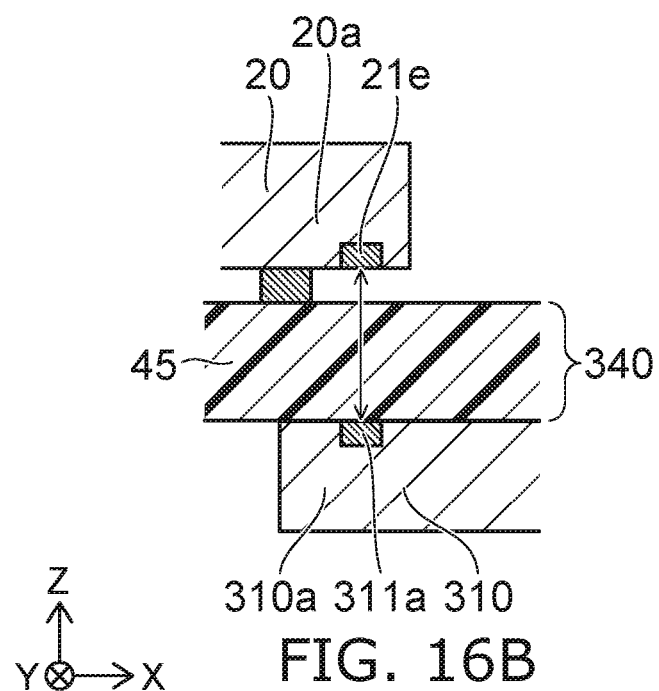
FIG. 16B is a schematic view showing a connectional relationship of a first chip and a second chip an electronic device according to an eighth embodiment.

FIG. 16B is a schematic cross-sectional view showing the connectional relationship between the first chip 310 and the second chip 20 of an electronic device according to an eighth embodiment.

The electronic device according to the eighth embodiment has the structure of the electronic device 4 shown in FIG. 11A in which the signal transfer portion between the first chip 310 and the second chip 20 is not the conductive member 341, which is replaced with an inductive coupling pair or a capacitive coupling pair.

The first chip 310 includes a first coupling element 311a provided in the first region 310a. The second chip 20 includes a second coupling element 21e provided in the third region 20a.

The insulating layer 45 of the interconnect layer 340 is provided between the first coupling element 311a and the second coupling element 21e. The conductive members of the interconnect layer 340 are not provided between the first coupling element 311a and the second coupling element 21e.

The direction from the first coupling element 311a toward the second coupling element 21e is aligned with the Z-axis direction.

For example, the first chip 310 can be fixed to the interconnect layer 340 by a bonding agent. Or, the first chip 310 can be directly coupled to the interconnect layer 340 by utilizing a dehydrating condensation reaction.

The first coupling element 311a and the second coupling element 21e are inductive coupling elements or capacitive coupling elements.

The first coupling element 311a of the first chip 310 and the second coupling element 21e of the second chip 20 have inductive coupling or capacitive coupling.

The signals are transmitted between the first chip 310 and the second chip 20 via the inductive coupling or the capacitive coupling between the first coupling element 311a and the second coupling element 21e.

The eighth embodiment may include the following configuration:
an electronic device, including:
a first chip including a first coupling element;
a second chip including a second coupling element; and
an insulating layer provided between the first coupling element and the second coupling element,
the first coupling element and the second coupling element having inductive coupling or capacitive coupling.

Figure 17:
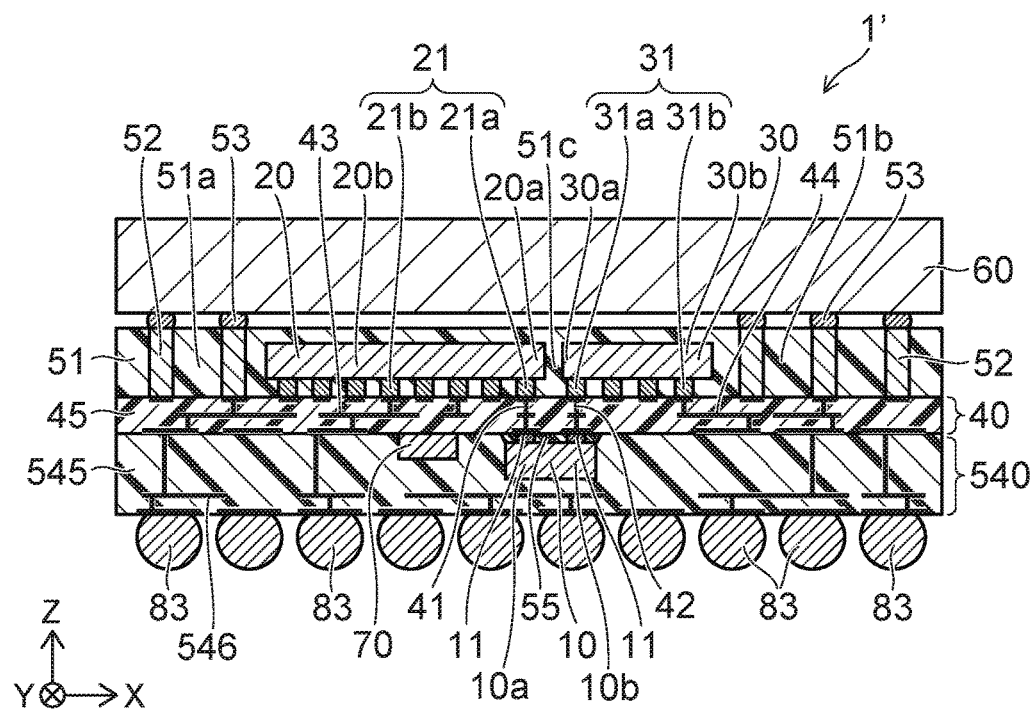
FIG. 17 is a schematic cross-sectional view of an electronic device of a modification of the electronic device shown in FIG. 1A.

FIG. 17 is a schematic cross-sectional view of an electronic device 1' of a modification of the electronic device 1 shown in FIG. 1A.

The electronic device 1' has the structure of the electronic device 1 shown in FIG. 1A in which the second interconnect layer 540 shown in FIG. 11B is provided. The multiple terminals 83 can be arranged over a wide region of the second interconnect layer 540 without constraints due to the arrangement position of the first chip 10. This makes it possible to accommodate the increase of the number of external input/output terminals accompanying the expanded function of the electronic device 1'.

Figure 18:
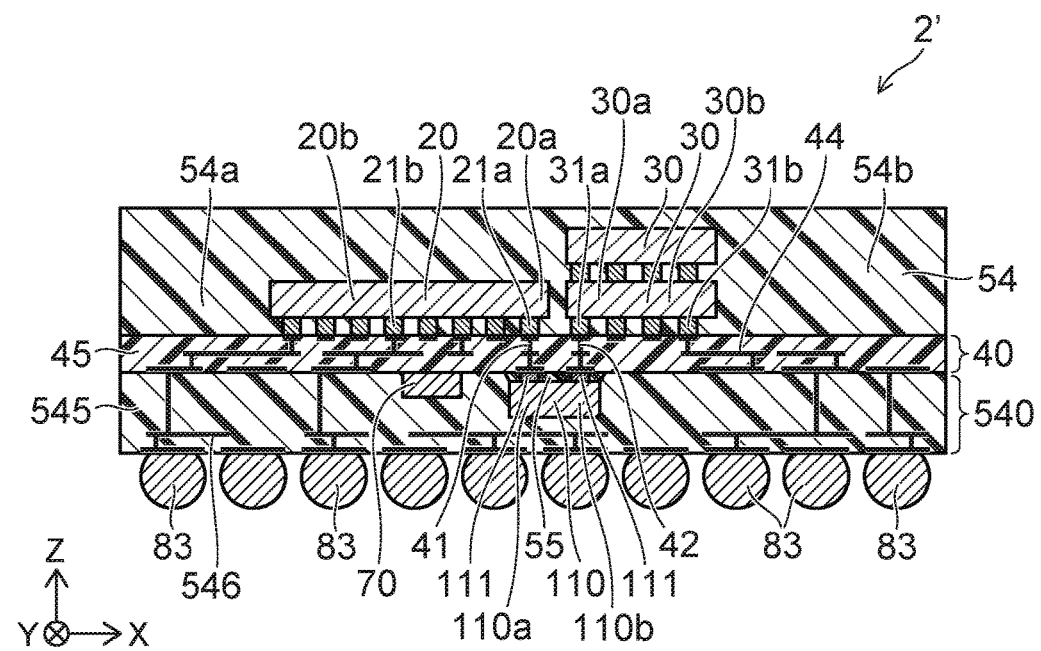
FIG. 18 is a schematic cross-sectional view of an electronic device of a modification of the electronic device shown in FIG. 7.

FIG. 18 is a schematic cross-sectional view of an electronic device 2' of a modification of the electronic device 2 shown in FIG. 7.

The electronic device 2' has the structure of the electronic device 2 shown in FIG. 7 in which the second interconnect layer 540 shown in FIG. 11B is provided. The multiple terminals 83 can be arranged over a wide region of the second interconnect layer 540 without constraints due to the arrangement position of the first chip 110. This makes it possible to accommodate the increase of the number of external input/output terminals accompanying the expanded function of the electronic device 1'.

Figure 19:
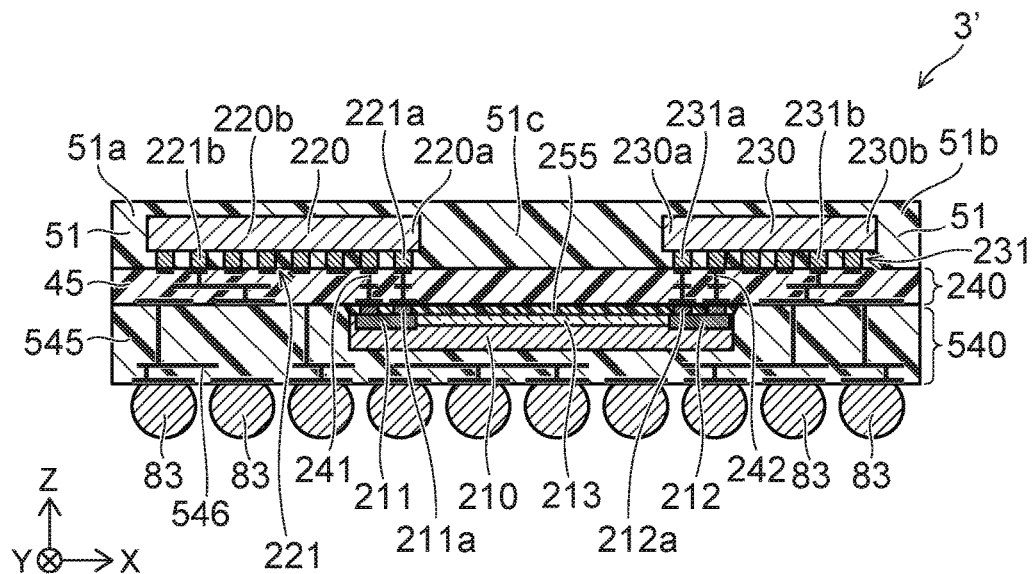
FIG. 19 is a schematic cross-sectional view of an electronic device of a modification of the electronic device shown in FIG. 10.

FIG. 19 is a schematic cross-sectional view of an electronic device 3' of a modification of the electronic device 3 shown in FIG. 10.

The electronic device 3' has the structure of the electronic device 3 shown in FIG. 10 in which the second interconnect layer 540 shown in FIG. 11B is provided. The multiple terminals 83 can be arranged over a wide region of the second interconnect layer 540 without constraints due to the arrangement position of the first chip 210. This makes it possible to accommodate the increase of the number of external input/output terminals accompanying the expanded function of the electronic device 1'.

Figure 20:
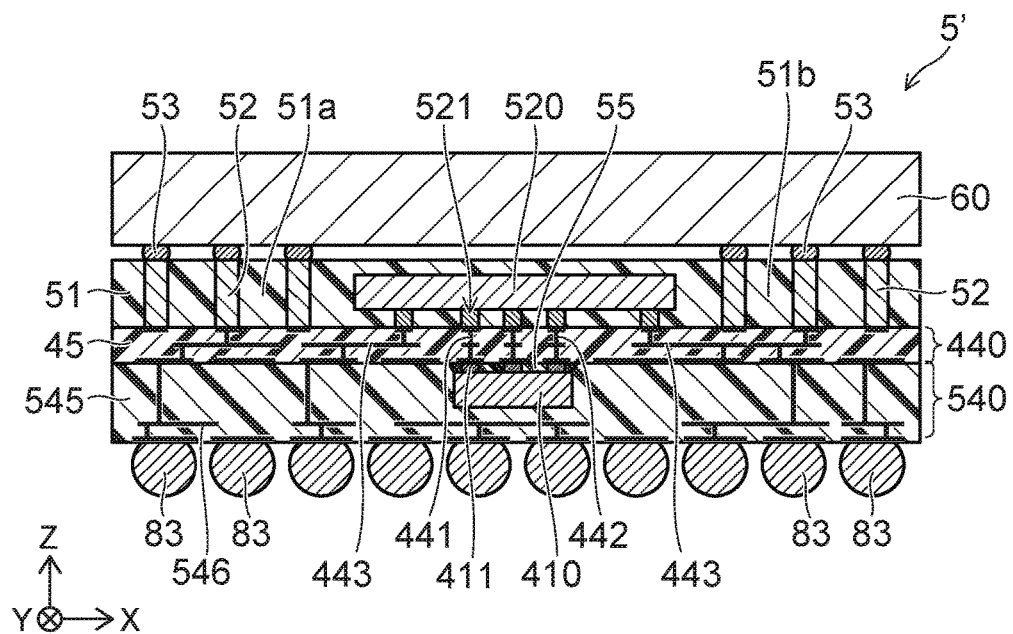
FIG. 20 is a schematic cross-sectional view of an electronic device of a modification of the electronic device shown in FIG. 13.

FIG. 20 is a schematic cross-sectional view of an electronic device 5' of a modification of the electronic device 5 shown in FIG. 13.

The electronic device 5' has the structure of the electronic device 5 shown in FIG. 13 in which the second interconnect layer 540 shown in FIG. 11B is provided. The multiple terminals 83 can be arranged over a wide region of the second interconnect layer 540 without constraints due to the arrangement position of the first chip 410. This makes it possible to accommodate the increase of the number of external input/output terminals accompanying the expanded function of the electronic device 1'.

Figure 21:
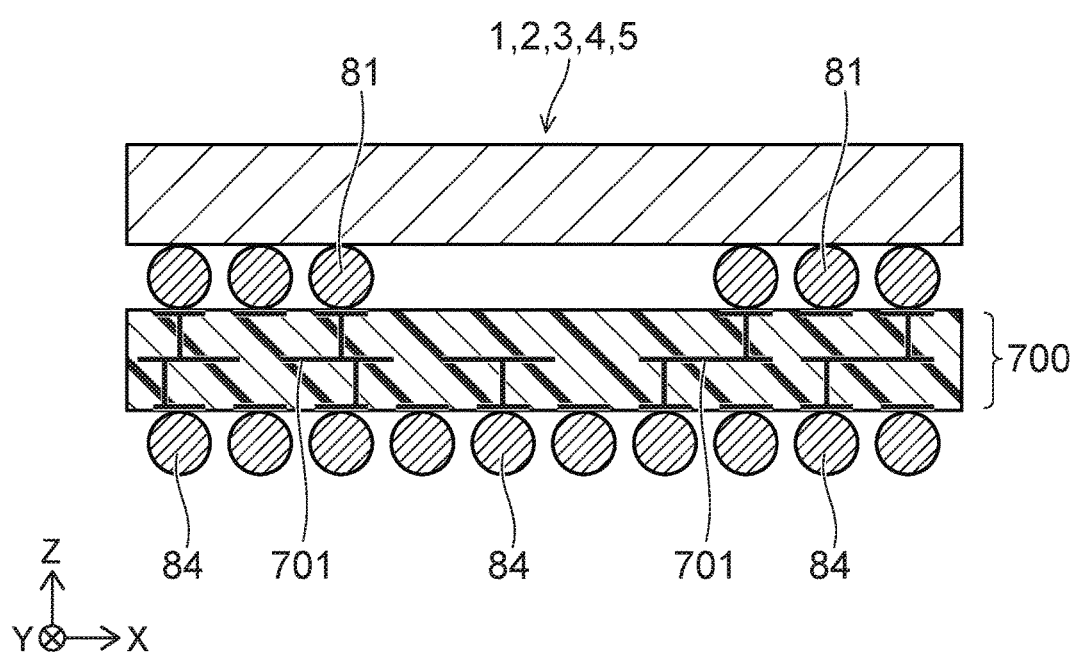
FIG. 21 is a schematic cross-sectional view of an electronic device according to an ninth embodiment.

FIG. 21 is a schematic cross-sectional view of an electronic device according to a ninth embodiment.

The electronic device according to the ninth embodiment has the structure of any of the electronic devices 1 to 5 described above in which a third interconnect layer 700 is provided.

The third interconnect layer 700 includes a conductive member 701 including a metal interconnect, a metal via, and a metal pad. Any of the electronic devices 1 to 5 is mounted on the third interconnect layer 700 via the multiple terminals 81. The terminals 81 are connected to the conductive member 701 of the third interconnect layer 700.

Multiple terminals 84 are provided on the opposite face of the mounting surface of the third interconnect layer 700 for the electronic devices 1 to 5. The terminals 84 are, for example, solder balls. The terminals 84 are connected to the conductive member 701 of the third interconnect layer 700. The multiple terminals 84 can be arranged over a wide region of the third interconnect layer 700 without constraints due to the arrangement position of the first chip of the electronic devices 1 to 5 described above. This makes it possible to accommodate the increase of the number of external input/output terminals accompanying the expanded function of the electronic device.

An example will now be described with reference to FIG. 22 to FIG. 26 in which the electronic device of the second embodiment shown in FIG. 7 to FIG. 9 described above is applied to a large-scale system.

Figure 22:
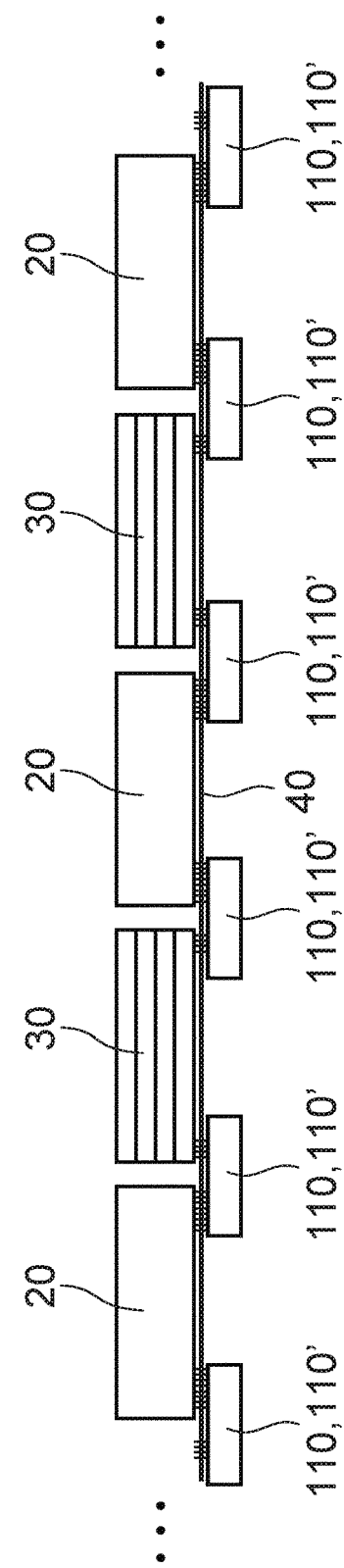
FIG. 22 is a schematic view showing an arrangement and connections of the first chip, the second chip, the third chip, and the interconnect layer according to the second embodiment.

FIG. 22 is a schematic view showing the arrangement and the connections of the first chips 110 and 110', the second chips 20, the third chips 30, and the interconnect layer 40. The interconnect layer 40 is schematically illustrated by one straight line.

Figure 23:
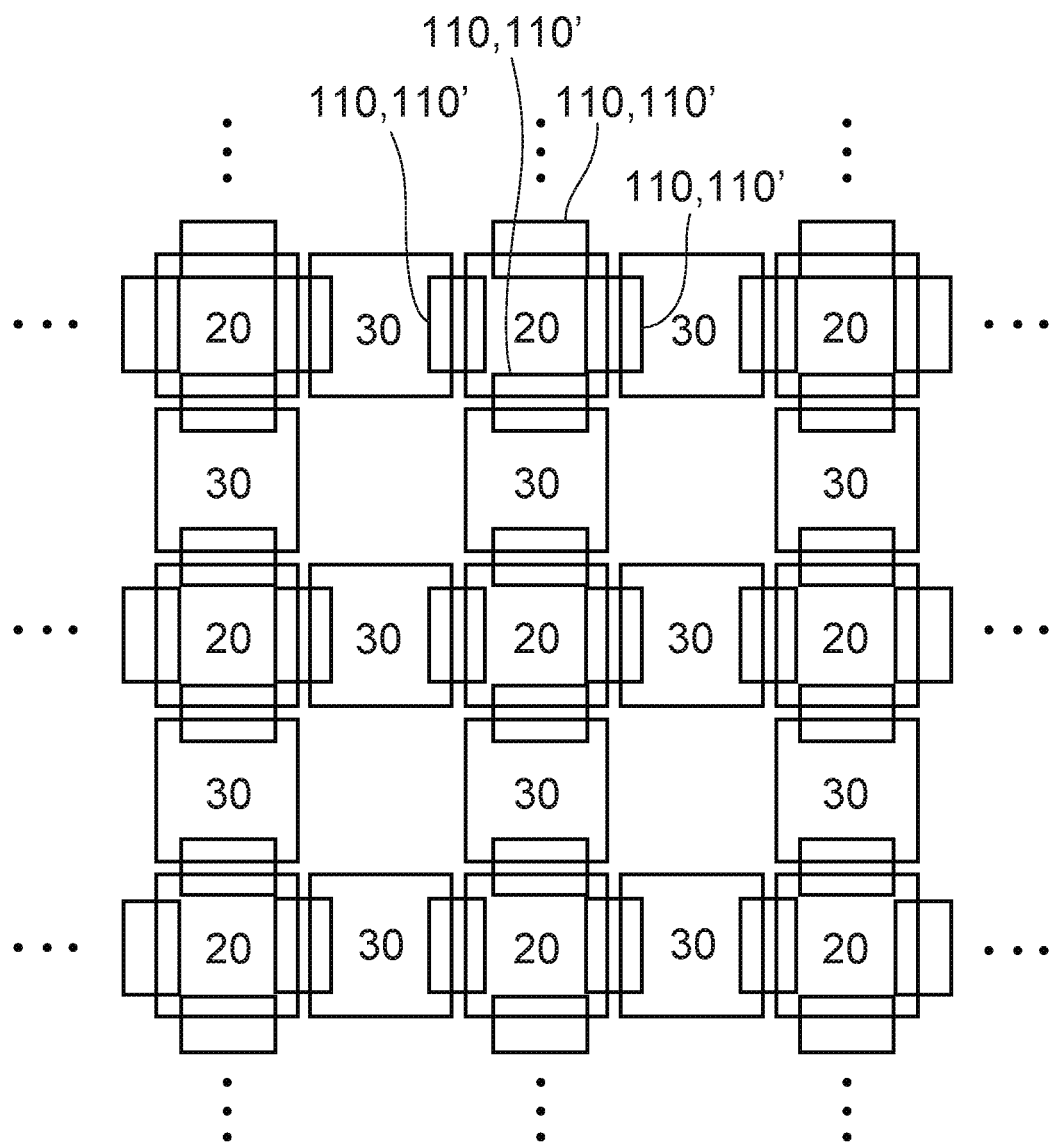
FIG. 23 is a schematic plan view of the electronic device shown in FIG. 22.

FIG. 23 is a schematic plan view of the electronic device shown in FIG. 22.

Figure 24:
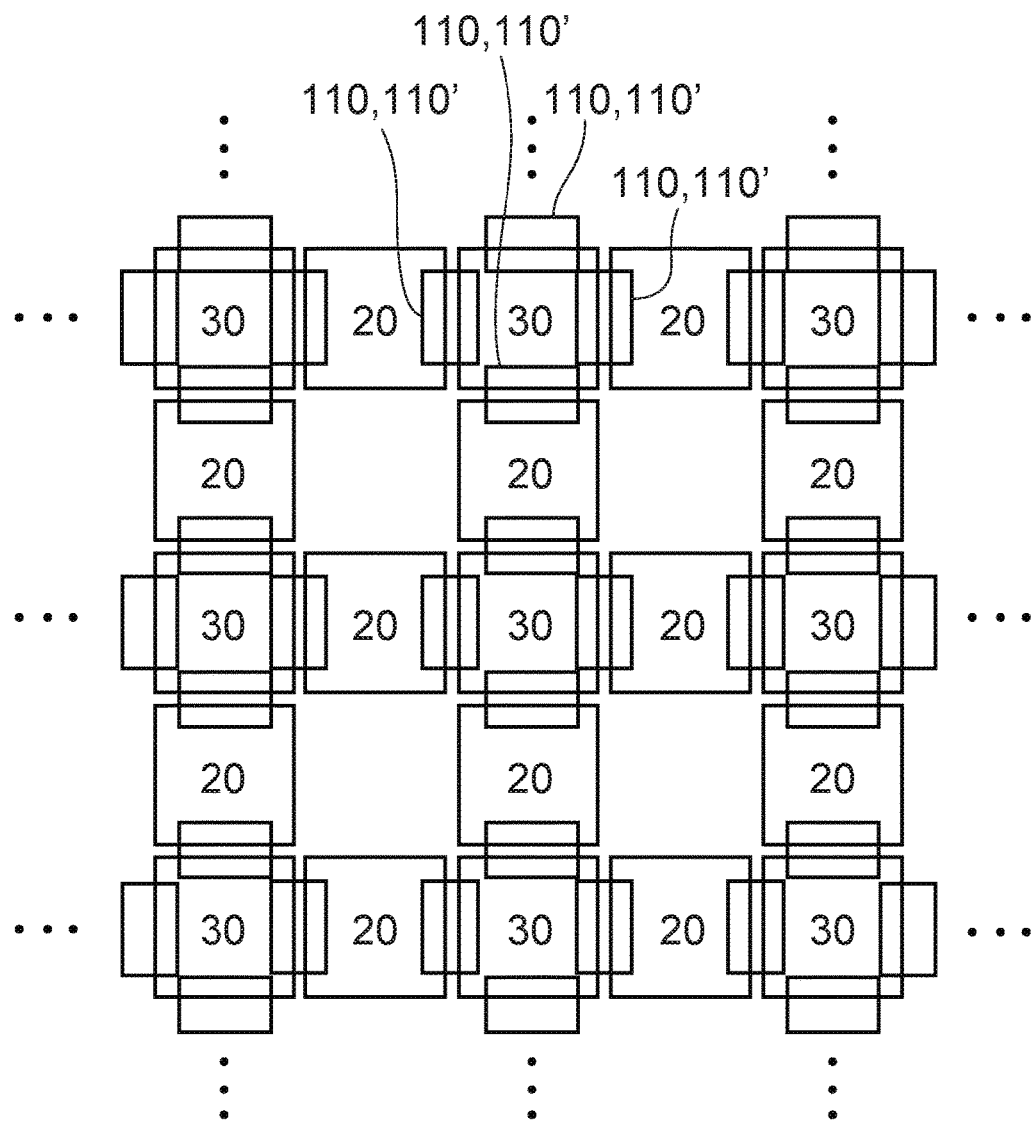
FIG. 24 is a schematic view in which positions of the second chips and positions of the third chips of FIG. 23 are interchanged.

FIG. 24 is a schematic view in which the positions of the second chips 20 and the positions of the third chips 30 of FIG. 23 are interchanged.

According to the example shown in FIG. 22 to FIG. 24, the multiple first chips 110 and 110', the multiple second chips 20, and the multiple third chips 30 are mounted to the interconnect layer 40. The third chips 30 can function as shared memory between mutually-adjacent second chips 20.

Figure 25:
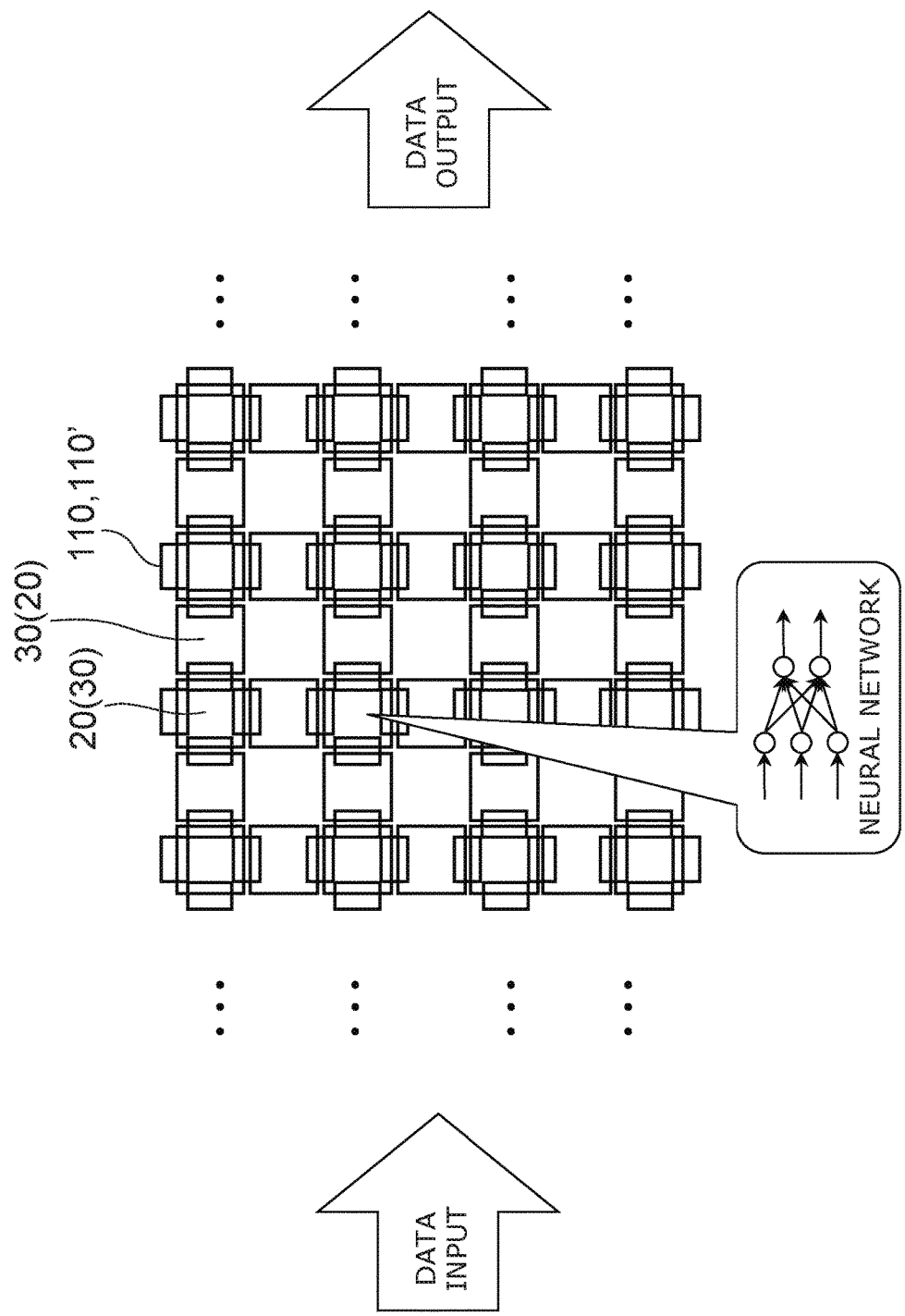
FIG. 25 is a schematic plan view showing an application example of the electronic device of the second embodiment to a neural network.

FIG. 25 is a schematic plan view showing an application example of the electronic device of the second embodiment to a neural network.

The input/output information, the connection information, etc., between the artificial neurons (the nodes) is stored in the second memory elements 115 of the third chips 30; and the logic elements of the second chips 20 execute calculation processing based on the information. A large-scale parallel neural network can be realized by arranging the second chips 20 and the third chips 30 in a matrix configuration and by mutually connecting with the first chips 10, 110, and 110'. The first chips may be used to store temporary calculation information in the case where memory elements are included in the first chips.

The data transfer to distal nodes may be executed by using the interconnects of the interconnect layer 40 or by sharing the memory of the third chips 30. By uniformly mixing and densely connecting the multiple memory elements and the multiple logic elements, a scalable system can be configured while minimizing the data transfer energy.

Figure 26:
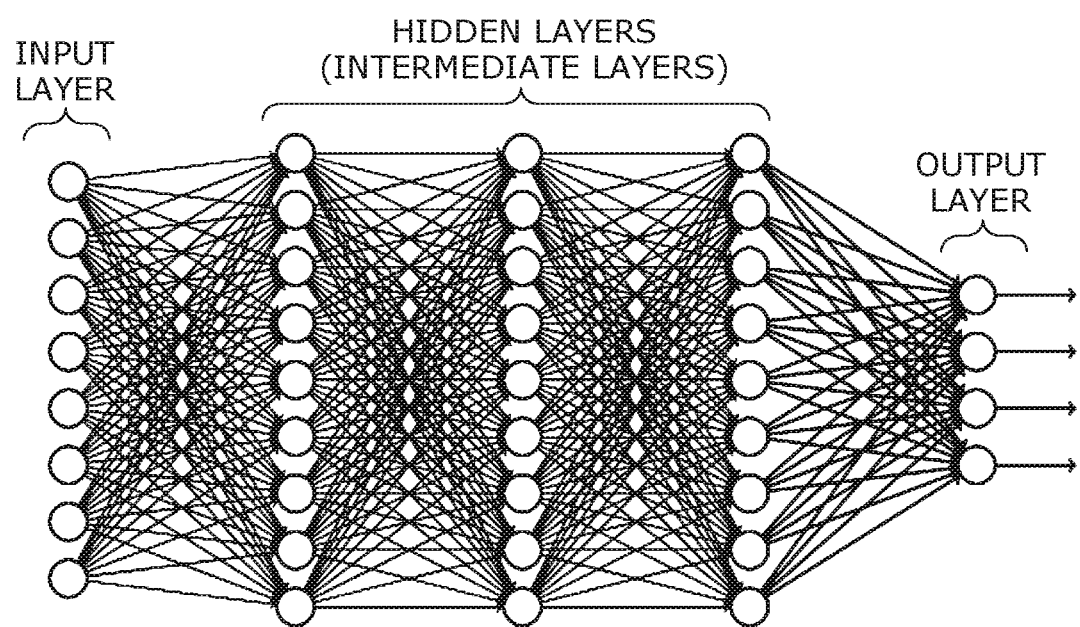
FIG. 26 is a descriptive view of a neural network.

FIG. 26 is a descriptive view of a neural network.

The neural network is a model that has problem solving ability in which artificial neurons (nodes) are formed in a network by the connections of synapses; and the connection strengths of the synapses are changed by learning. As shown in FIG. 26, a neural network that is connected in multiple layers is called a deep neural network and has been utilized in various fields in recent years.

Figure 27:
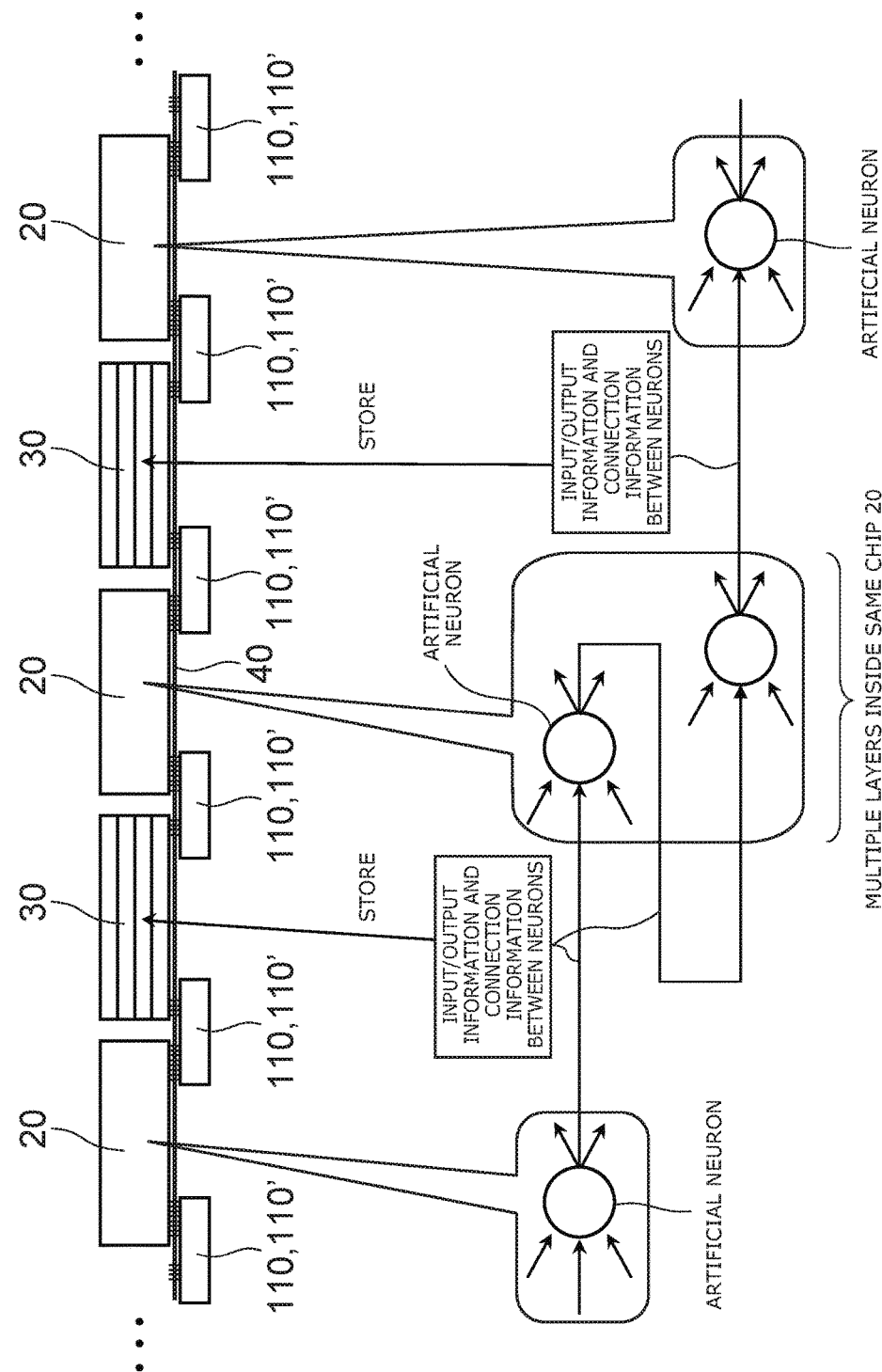
FIG. 27 is a schematic plan view showing an application example of the electronic device of the second embodiment to a neural network.

FIG. 27 is a schematic view showing an application example of the electronic device of the second embodiment to a neural network.

The input/output information, the connection information, etc., between the artificial neurons (the nodes) is stored in the second memory elements 115 of the third chips 30 and shared between the multiple second chips 20; and the logic elements of the second chips 20 execute calculation processing based on the information.

In the processing of a neural network using a conventional GPU (Graphics Processing Unit), etc., it is necessary to repeat the data transfer between the memory elements and the logic elements for the calculation for each layer; and there is a limit to the energy efficiency and the processing performance.

In the embodiment as shown in FIG. 27, by spatially dispersing the calculation processing of multiple layers and by executing in multi-parallel, it is possible to approach the information processing performance and the efficiency of an actual brain.

Figure 28:
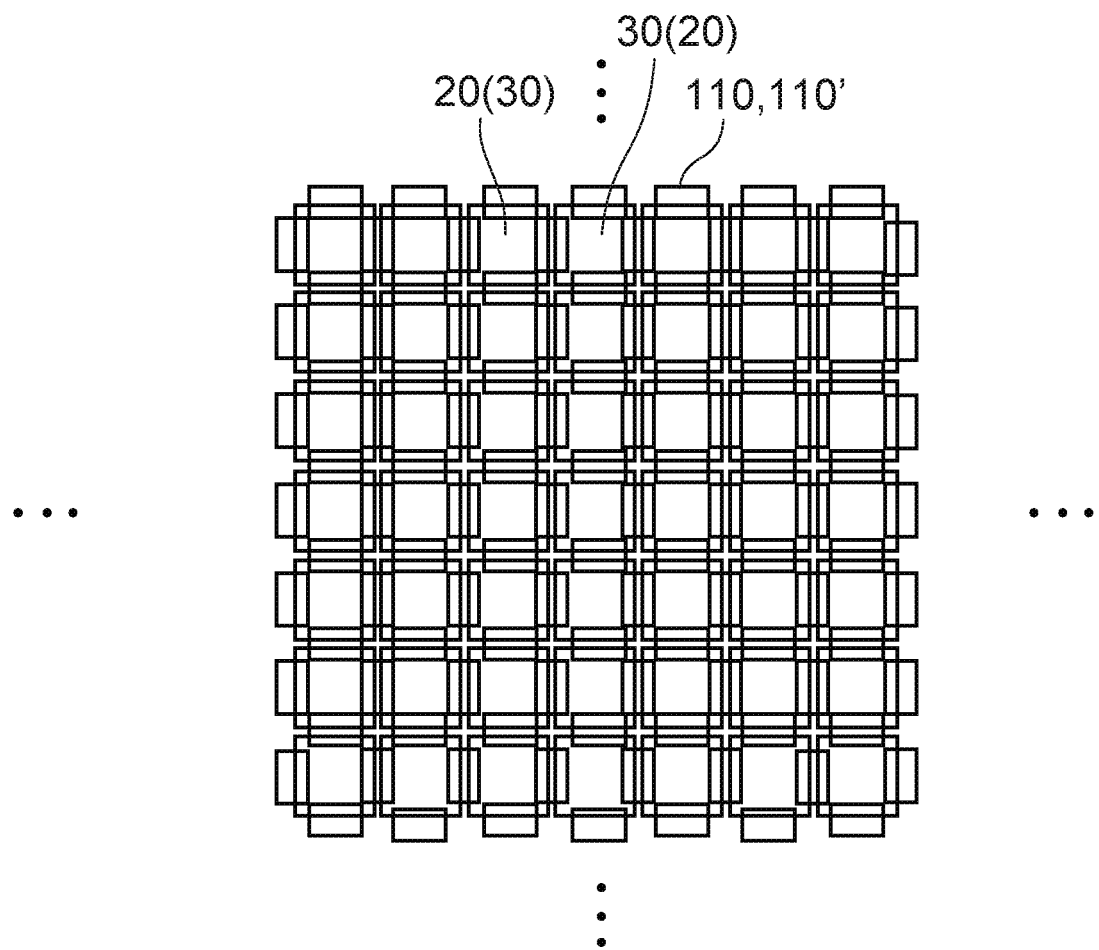
FIG. 28 is a schematic plan view showing a full grid tile structure of the first chips, the second chips, and the third chips of the electronic device according to the second embodiment.

FIG. 28 is a schematic plan view showing the full grid tile structure of the first chips 110 and 110', the second chips 20, and the third chips 30.

The full grid tile structure is formed by the multiple second chips 20 and the multiple third chips 30 being densely connected by the multiple first chips 110 and 110'.

Figure 29:
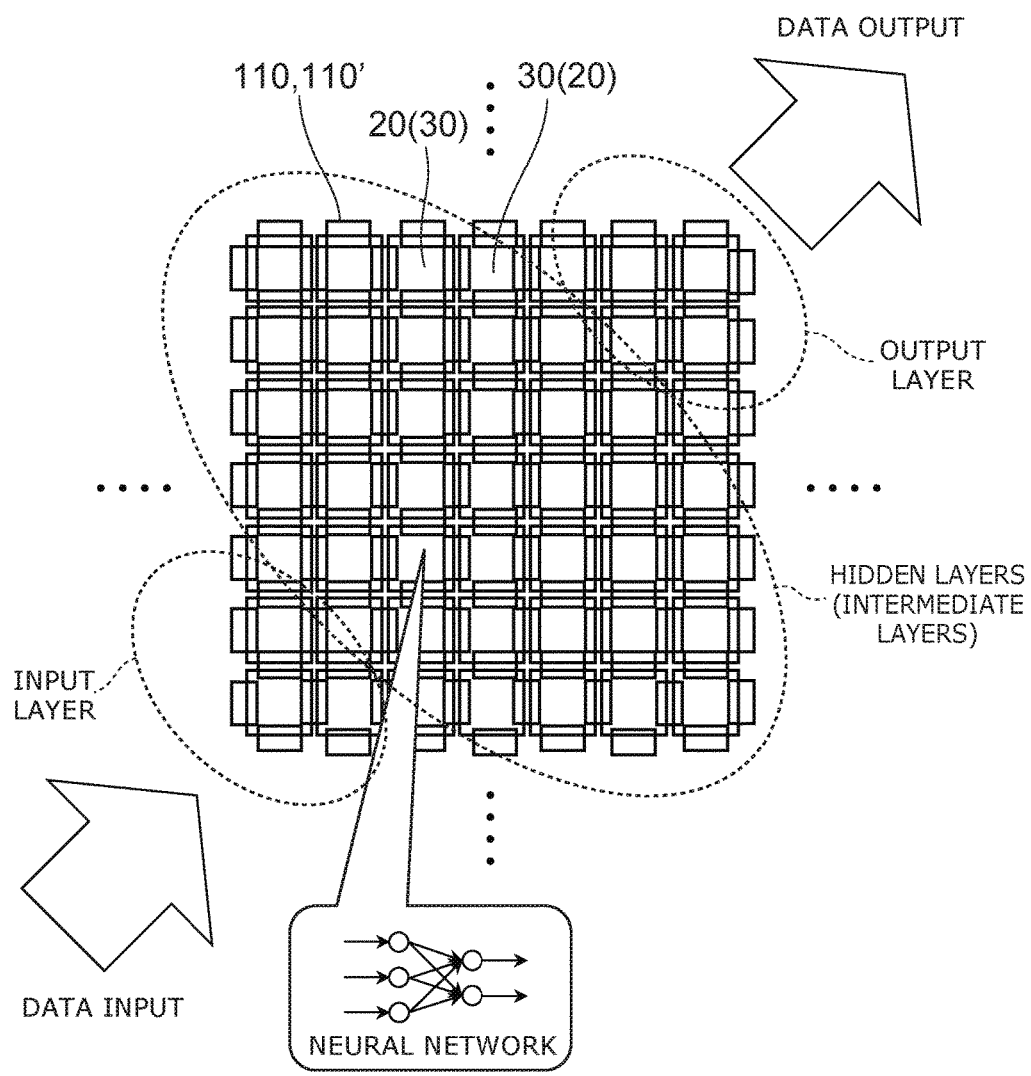
FIG. 29 is a schematic plan view showing an application example of the embodiment shown in FIG. 28 to a neural network.

The full grid tile structure shown in FIG. 28 also is applicable to a neural network as shown in FIG. 29.

Compared to the configuration shown in FIG. 25, the configuration shown in FIG. 28 can improve the calculation performance and increase the neural network processing efficiency per unit surface area.

The embodiments described above may include the following configuration.

The interconnect layers 40, 240, 340, 440, and 540 are aligned with a plane including the second direction and a third direction. The second direction is aligned with the X-axis direction; and the third direction crosses the second direction. For example, the third direction is orthogonal to the second direction and is aligned with the Y-axis direction.

The multiple first terminals 81, the multiple second terminals 82, the multiple third terminals 181, and the multiple terminals 83 described above are arranged in the second direction and the third direction in a plane including the second direction and the third direction. In other words, the multiple first terminals 81, the multiple second terminals 82, the multiple third terminals 181, and the multiple terminals 83 are arranged in an array configuration in a plane including the second direction and the third direction.

The conductive members 41 and 42, 241, 242, 341, 441, and 442 described above are aligned with the first direction crossing the plane recited above. For example, the conductive members 41 and 42, 241, 242, 341, 441, and 442 are aligned with a direction substantially perpendicular to the plane recited above.

The first chip 10 of the embodiment shown in FIGS. 1A and 1B is an electrical interconnect member that has a chip configuration including the first conductive member 11 electrically connecting the second chip 20 and the third chip 30 and does not include a memory element, a transistor, or a passive element.

The first chip 310 or the second chip 20 shown in FIG. 11A, FIG. 11B, and FIG. 16B includes a memory element.

Figure 30:
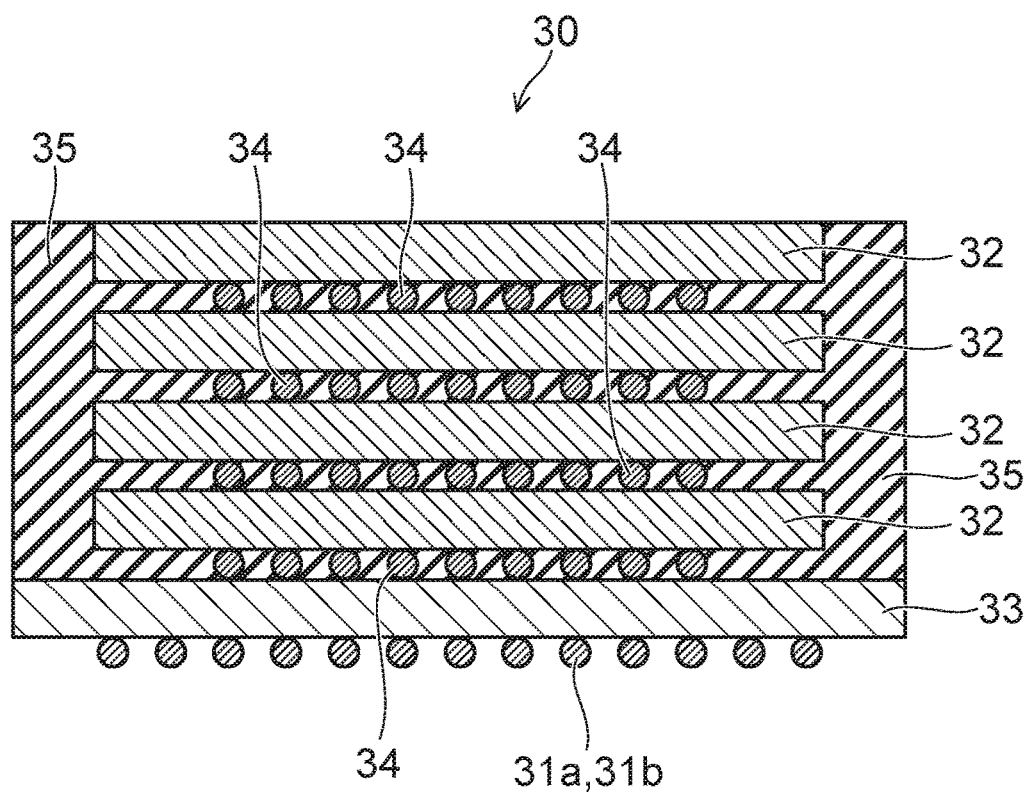
FIG. 30 is a schematic cross-sectional view of an example of the third chip according to the embodiments.

FIG. 30 is a schematic cross-sectional view of an example of the third chip 30 of the above embodiments.

The third chip 30 has a stacked memory structure including a plurality of memory chips 32 and a logic chip 33. The memory chips 32 are stacked on the logic chip 33. Each of the memory chips 32 includes the second memory element 115 shown in FIG. 8A to FIG. 9. The memory chips 32 are connected each other through a plurality of metal pads or metal bumps 34. The memory chips 32 are electrically connected to the logic chip 33 through the metal pads or metal bumps 34. The logic chip 33 is electrically connected to the signal terminals 31a, 31b of the third chip 30 shown in FIG. 8A to FIG. 9. The memory chips 32 are molded by a resin 35.

Note 1

An electronic device, comprising:
a first chip including a first optical element, a second optical element, and an optical waveguide optically coupled to the first optical element and the second optical element;
a second chip including a first conductive member, a first region, and a second region;
a third chip including a second conductive member, a third region, and a fourth region;
a first terminal;
a second terminal; and
an interconnect layer provided between the first optical element of the first chip and the first region of the second chip, between the second optical element of the first chip and the third region of the third chip, between the first terminal and the second region of the second chip, and between the second terminal and the fourth region of the third chip,
the interconnect layer including
a third conductive member provided between the first optical element of the first chip and the first region of the second chip, the third conductive member connecting the first optical element of the first chip and the first conductive member of the second chip, and
a fourth conductive member provided between the second optical element of the first chip and the third region of the third chip, the fourth conductive member connecting the second optical element of the first chip and the second conductive member of the third chip,
the first chip being provided between the first terminal and the second terminal.

Note 2

The electronic device according to Note 1, wherein
the second chip further includes a first power supply terminal,
the third chip further includes a second power supply terminal, and
the interconnect layer further includes a fifth conductive member and a sixth conductive member, the fifth conductive member connecting the first power supply terminal and the first terminal, the sixth conductive member connecting the second power supply terminal and the second terminal.

Note 3

An electronic device, comprising:
a first chip including a memory element and a first capacitor; and
a second chip including a first terminal and a second terminal, the first terminal being connected to the memory element, the second terminal being connected to the first capacitor.

Note 4

The electronic device according to Note 3, further comprising an interconnect layer provided between the first chip and the second chip,
the interconnect layer including
a first conductive member provided between the memory element of the first chip and the first terminal of the second chip, the first conductive member connecting the memory element of the first chip and the first terminal of the second chip, and a second conductive member provided between the first capacitor of the first chip and the second terminal of the second chip, the second conductive member connecting the first capacitor of the first chip and the second terminal of the second chip.

Note 5

The electronic device according to Note 4, further comprising a third terminal, the interconnect layer further including a third conductive member provided between the third terminal and the second terminal of the second chip, the third conductive member connecting the third terminal and the second terminal of the second chip.

Note 6

The electronic device according to any one of Notes 3 to 5, wherein the first chip further includes an insulating separation portion provided between the memory element and the first capacitor.

Note 7

The electronic device according to any one of Notes 3 to 6, wherein the memory element is DRAM (Dynamic Random Access Memory) including a second capacitor.

Note 8

An electronic device, comprising:

a first chip including a first conductive member, a first region, and a second region;

a second chip including a second conductive member, a third region, and a fourth region;

a third chip including a third conductive member, a fifth region, and a sixth region;

a first terminal;

a second terminal; and an interconnect layer provided between the first region of the first chip and the third region of the second chip, between the second region of the first chip and the fifth region of the third chip, between the first terminal and the fourth region of the second chip, and between the second terminal and the sixth region of the third chip, the interconnect layer including a fourth conductive member provided between the first region of the first chip and the third region of the second chip, the fourth conductive member connecting the first conductive member of the first chip and the second conductive member of the second chip, and a fifth conductive member provided between the second region of the first chip and the fifth region of the third chip, the fifth conductive member connecting the first conductive member of the first chip and the third conductive member of the third chip, the first chip being provided between the first terminal and the second terminal.

Note 9

The electronic device according to Note 8, wherein the first chip is an electrical interconnect member connecting the second chip and the third chip via the first conductive member, the fourth conductive member, and the fifth conductive member.

Note 10

The electronic device according to Note 9, wherein the first chip does not include a substrate.

Note 11

The electronic device according to Note 9, wherein the third chip includes a memory element.

Note 12

The electronic device according to Note 8, wherein the first chip further includes a first memory element connected to the fourth conductive member.

Note 13

The electronic device according to Note 12, wherein the third chip further includes a second memory element connected to the fifth conductive member.

Note 14

The electronic device according to Note 13, wherein a memory capacity of the second memory element is larger than a memory capacity of the first memory element.

Note 15

The electronic device according to Note 13 or 14, wherein the first chip further includes a controller connected to the fifth conductive member.

Note 16

The electronic device according to any one of Notes 8 to 15, wherein the second chip further includes a first power supply terminal, the third chip further includes a second power supply terminal, and the interconnect layer further includes a sixth conductive member and a seventh conductive member, the sixth conductive member connecting the first power supply terminal and the first terminal, the seventh conductive member connecting the second power supply terminal and the second terminal.

Note 17

The electronic device according to Note 16, wherein the interconnect layer further includes an insulating layer provided between the fourth conductive member and the sixth conductive member and between the fifth conductive member and the seventh conductive member, the fourth conductive member and the sixth conductive member are insulatively separated, and the fifth conductive member and the seventh conductive member are insulatively separated.

Note 18

An electronic device, comprising:

a first chip including a first conductive member, a first region, and a second region;

a second chip including a second conductive member, a third region, and a fourth region;

a resin portion including a first resin region and a second resin region;

a terminal; and a first interconnect layer provided between the first region of the first chip and the third region of the second chip, between the second region of the first chip and the first resin region, between the terminal and the fourth region of the second chip, and between the terminal and the second resin region, the first interconnect layer including a third conductive member provided between the first region of the first chip and the third region of the second chip, the third conductive member connecting the first conductive member of the first chip and the second conductive member of the second chip, the second chip being provided between the first resin region and the second resin region of the resin portion.

Note 19

The electronic device according to Note 18, wherein the second chip further includes a power supply terminal, and the first interconnect layer further includes a fourth conductive member connecting the power supply terminal and the terminal.

Note 20
The electronic device according to Note 18 or 19, further comprising a second interconnect layer provided between the first interconnect layer and the terminal,
the second interconnect layer including a fifth conductive member and an insulating portion, the fifth conductive member being connected to the terminal, the insulating portion being provided between the terminal and the first chip,
the first chip being provided between the insulating portion and the first interconnect layer.

Note 21
The electronic device according to any one of Notes 18 to 20, wherein the first chip or the second chip includes a memory element.

Note 22
An electronic device, comprising:
a first chip including a first connection region and a second connection region;
a second chip including a third connection region facing the first connection region of the first chip; and
a third chip including a fourth connection region facing the second connection region of the first chip,
the first chip including a first memory element and a plurality of first interconnects, the first chip including a plurality of first signal terminals provided in the first connection region and electrically connected to the first memory element, the plurality of first interconnects being provided in the first connection region and the second connection region,
the second chip including a plurality of second signal terminals and a plurality of third signal terminals, the plurality of second signal terminals being provided in the third connection region, the plurality of third signal terminals being provided in the third connection region,
the third chip including a second memory element and a plurality of fourth signal terminals electrically connected to the second memory element, the plurality of fourth signal terminals being provided in the fourth connection region,
the second signal terminals of the second chip being connected to the first terminals of the first chip,
the first interconnects being connected to the third signal terminals of the second chip and the fourth signal terminals of the third chip.

Note 23
The electronic device according to Note 22, further comprising an interconnect layer provided between the first chip and the second chip, and between the first chip and the third chip,
the interconnect layer including
a plurality of first metal vias connecting the second signal terminals of the second chip and the first signal terminals of the first chip,
a plurality of second metal vias connecting the first interconnects and the third signal terminals of the second chip,
a plurality of third metal vias connecting the first interconnects and the fourth signal terminals of the third chip, and
a plurality of second interconnects connecting the second chip and the third chip to an outside.

Note 24
The electronic device according to Note 23, wherein a minimum spacing of the multiple first interconnects provided in the first chip is smaller than a minimum spacing of the multiple second interconnects provided in the interconnect layer.

Note 25
The electronic device according to any one of Notes 22 to 24, wherein a memory capacity of the second memory element is larger than a memory capacity of the first memory element.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in electronic devices such as interconnect layers, electrical elements, optical elements, resin portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all electronic devices, and methods for manufacturing the same practicable by an appropriate design modification by one skilled in the art based on the electronic devices, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. An electronic device, comprising:
a first chip including a first conductive member, a first region, and a second region;
a second chip including a second conductive member, a third region, and a fourth region;
a third chip including a third conductive member, a fifth region, and a sixth region;
a first terminal;
a second terminal; and
an interconnect layer provided between the first region of the first chip and the third region of the second chip, between the second region of the first chip and the fifth region of the third chip, between the first terminal and the fourth region of the second chip, and between the second terminal and the sixth region of the third chip,
the interconnect layer including
a fourth conductive member provided between the first region of the first chip and the third region of the second chip, the fourth conductive member connecting the first conductive member of the first chip and the second conductive member of the second chip, and
a fifth conductive member provided between the second region of the first chip and the fifth region of the third chip, the fifth conductive member connecting the first conductive member of the first chip and the third conductive member of the third chip, the first chip being provided between the first terminal and the second terminal, and being an electrical interconnect member connecting the second chip and the third chip via the first conductive member, the fourth conductive member, and the fifth conductive member.

2. The device according to claim 1, wherein the first chip does not include a substrate.

3. The device according to claim 1, wherein the third chip includes a memory element.

4. The device according to claim 1, wherein the first chip further includes a first memory element connected to the fourth conductive member.

5. The device according to claim 4, wherein the third chip further includes a second memory element connected to the fifth conductive member.

6. The device according to claim 5, wherein a memory capacity of the second memory element is larger than a memory capacity of the first memory element.

7. The device according to claim 5, wherein the first chip further includes a controller connected to the fifth conductive member.

8. The device according to claim 1, wherein
the second chip further includes a first power supply terminal,
the third chip further includes a second power supply terminal, and
the interconnect layer further includes a sixth conductive member and a seventh conductive member, the sixth conductive member connecting the first power supply terminal and the first terminal, the seventh conductive member connecting the second power supply terminal and the second terminal.

9. The device according to claim 8, wherein
the interconnect layer further includes an insulating layer provided between the fourth conductive member and the sixth conductive member, and between the fifth conductive member and the seventh conductive member,
the fourth conductive member and the sixth conductive member are insulatively separated, and
the fifth conductive member and the seventh conductive member are insulatively separated.

10. An electronic device, comprising:
a first chip including a first conductive member, a first region, and a second region;
a second chip including a second conductive member, a third region, and a fourth region;
a third chip including a third conductive member, a fifth region, and a sixth region;
a first terminal;
a second terminal; and
an interconnect layer provided between the first region of the first chip and the third region of the second chip, between the second region of the first chip and the fifth region of the third chip, between the first terminal and the fourth region of the second chip, and between the second terminal and the sixth region of the third chip,
the interconnect layer including
a fourth conductive member provided between the first region of the first chip and the third region of the second chip, the fourth conductive member connecting the first conductive member of the first chip and the second conductive member of the second chip, and
a fifth conductive member provided between the second region of the first chip and the fifth region of the third chip, the fifth conductive member connecting the first conductive member of the first chip and the third conductive member of the third chip,
the first chip being provided between the first terminal and the second terminal, and including a first memory element connected to the fourth conductive member, and
the third chip including a second memory element connected to the fifth conductive member.

11. The device according to claim 10, wherein a memory capacity of the second memory element is larger than a memory capacity of the first memory element.

12. The device according to claim 10, wherein the first chip further includes a controller connected to the fifth conductive member.

13. The device according to claim 10, wherein
the second chip further includes a first power supply terminal,
the third chip further includes a second power supply terminal, and
the interconnect layer further includes a sixth conductive member and a seventh conductive member, the sixth conductive member connecting the first power supply terminal and the first terminal, the seventh conductive member connecting the second power supply terminal and the second terminal.

14. The device according to claim 13, wherein
the interconnect layer further includes an insulating layer provided between the fourth conductive member and the sixth conductive member, and between the fifth conductive member and the seventh conductive member,
the fourth conductive member and the sixth conductive member are insulatively separated, and
the fifth conductive member and the seventh conductive member are insulatively separated.

* * * * *